United States Patent
Cohen et al.

(10) Patent No.: US 7,811,427 B2
(45) Date of Patent: Oct. 12, 2010

(54) MONOLITHIC STRUCTURES INCLUDING ALIGNMENT AND/OR RETENTION FIXTURES FOR ACCEPTING COMPONENTS

(75) Inventors: Adam L. Cohen, Los Angeles, CA (US); Daniel I. Feinberg, Sylmar, CA (US); Christopher A. Bang, San Diego, CA (US)

(73) Assignee: Microfabrica Inc., Van Nuys, CA (US)

( * ) Notice: Subject to any disclaimer, the term of this patent is extended or adjusted under 35 U.S.C. 154(b) by 667 days.

(21) Appl. No.: 11/685,118

(22) Filed: Mar. 12, 2007

(65) Prior Publication Data

US 2008/0062638 A1    Mar. 13, 2008

Related U.S. Application Data

(63) Continuation of application No. 10/677,556, filed on Oct. 1, 2003, now abandoned.

(60) Provisional application No. 60/415,374, filed on Oct. 1, 2002.

(51) Int. Cl.
*C25D 17/06* (2006.01)

(52) U.S. Cl. .............. 204/297.05; 204/224 R; 361/807; 382/141; 382/144; 382/145; 382/147; 382/151; 205/118; 205/122; 205/135; 205/145; 205/170; 205/220; 205/223

(58) Field of Classification Search .......... 204/297.05, 204/224 M; 361/807; 382/141, 144, 145, 382/147, 151; 430/312–316, 318, 319, 329, 430/331; 205/118, 122, 135, 145, 170, 220, 205/223

See application file for complete search history.

(56) References Cited

U.S. PATENT DOCUMENTS

| | | | |
|---|---|---|---|
| 5,190,637 A | 3/1993 | Guckel | 205/118 |
| 5,659,647 A | 8/1997 | Kravitz et al. | 385/52 |
| 5,737,346 A * | 4/1998 | Stenstrom | 372/21 |
| 6,027,630 A | 2/2000 | Cohen | 205/135 |

(Continued)

FOREIGN PATENT DOCUMENTS

WO    WO 01/37005    11/2000

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner*—Bruce F Bell
(74) *Attorney, Agent, or Firm*—Dennis R. Smalley

(57) ABSTRACT

Permanent or temporary alignment and/or retention structures for receiving multiple components are provided. The structures are preferably formed monolithically via a plurality of deposition operations (e.g. electrodeposition operations). The structures typically include two or more positioning fixtures that control or aid in the positioning of components relative to one another, such features may include (1) positioning guides or stops that fix or at least partially limit the positioning of components in one or more orientations or directions, (2) retention elements that hold positioned components in desired orientations or locations, and/or (3) positioning and/or retention elements that receive and hold adjustment modules into which components can be fixed and which in turn can be used for fine adjustments of position and/or orientation of the components.

18 Claims, 21 Drawing Sheets

U.S. PATENT DOCUMENTS 6,281,445 B1 * 8/2001 Yokoyama ................. 174/250
2002/0110957 A1 * 8/2002 King et al. ................. 438/127

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Kravitz, et al., "A Passive Micromachined Device for Alignment of Arrays of Single-mode Fibers for Manufacturable Photonic Packaging", Lasers and Electro-optics Society Annual Meeting, IEEE Oct. 31, 1994, vol. 1, pp. 226-227.

* cited by examiner

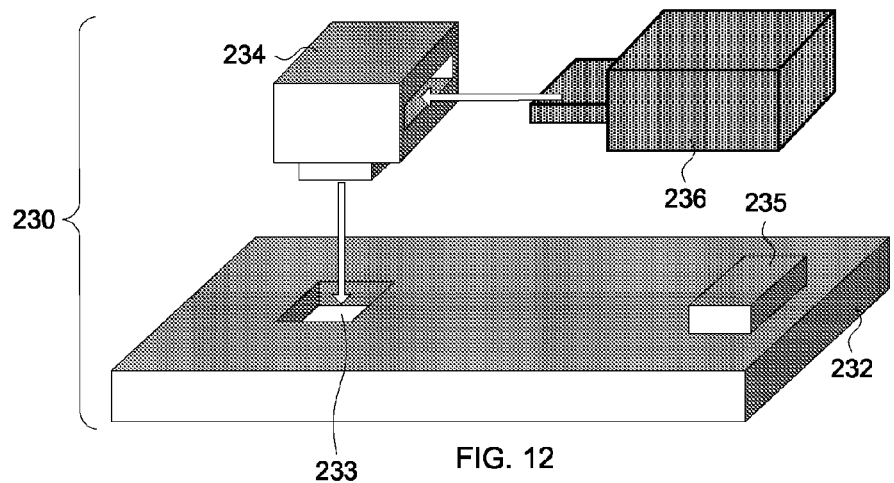
FIG. 12
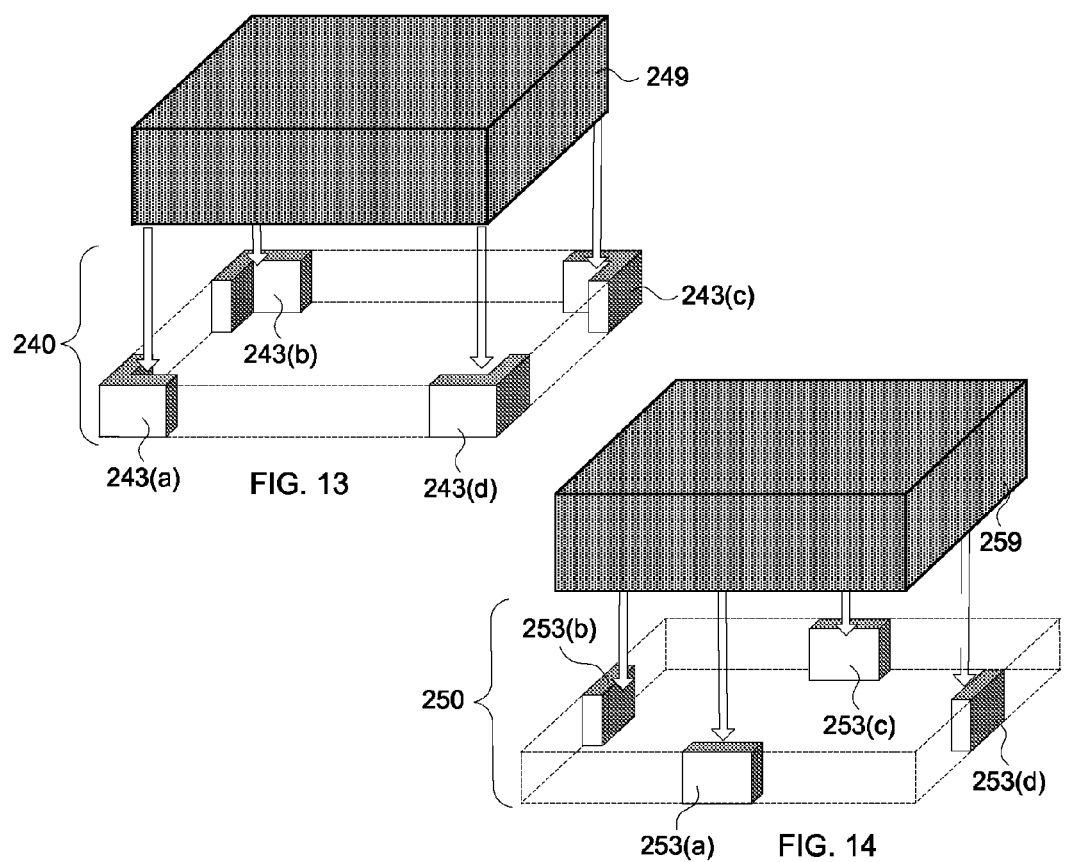
FIG. 13
FIG. 14

MONOLITHIC STRUCTURES INCLUDING ALIGNMENT AND/OR RETENTION FIXTURES FOR ACCEPTING COMPONENTS

RELATED APPLICATIONS

This application is a continuation of U.S. Non-Provisional patent application Ser. No. 10/677,556 filed Oct. 1, 2003 now abandoned which claims benefit of U.S. Provisional Patent Application No. 60/415,374, filed Oct. 1, 2002. These prior applications are incorporated herein by reference as if set forth in full.

FIELD OF THE INVENTION

Embodiments of this invention relate to precision alignment and/or retention structures that may be used to align and/or retain multiple components in desired locations relative to one another or relative to other components that are fixed in position relative to the alignment structure. More particularly some embodiments relates to alignment and/or retention structures that can be prototyped or manufactured using, at least in part, a multi-layer electrodeposition technique known as Electrochemical Fabrication.

BACKGROUND

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) "Microfabrication—Rapid Prototyping's Killer Application", pages 1-5 of the Rapid Prototyping Report, CAD/CAM Publishing, Inc., June 1999.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that comprises a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers. This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the design and product spectrum in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art within the field or fields of a specific application.

A need exists in the field of aligning and/or retaining components, and particularly in the field of precision alignment structures and/or retention structures, for enhanced alignment and/or retention methods and structures that can be used to reduce manufacturing costs, enhance reliability of assemblies, reduce the amount of labor, or skilled labor required to align and/or retain critical components.

SUMMARY OF THE INVENTION

An object of various aspects of the invention is to provide improved alignment and/or retention structures for receiving components.

An object of various aspects of the invention is to provide a reduction in manufacturing costs for devices requiring the alignment and/or retention of various components.

An object of various aspects of the invention is to provide a reduction in skilled labor required to assemble devices having components that need precise relative alignment and/or retention.

Other objects and advantages of various aspects of the invention will be apparent to those of skill in the art upon review of the teachings herein. The various aspects of the invention, set forth explicitly herein or otherwise ascertained from the teaching herein, may address any one of the above objects alone or in combination, or alternatively may address some other object of the invention ascertained from the teachings herein. It is not intended that all of these objects be addressed by any single aspect of the invention even though that may be the case with regard to some aspects.

It is an aspect of the invention to provide an alignment and/or retention structure for receiving a plurality of components, that includes a base; a plurality of alignment and/or retention fixtures attached to the base and having desired positions relative to one another, wherein one or more of the following conditions are met: (1) the base and the alignment and/or retention fixtures are substantially monolithic, (2) the alignment and/or retention fixtures comprise at least one material deposited on substantially a layer-by-layer basis, or (3) the alignment and/or retention fixtures are formed in a single process in their respective relative positions.

It is an aspect of the invention to provide a device, that includes (a) an alignment and/or retention structure, that includes (1) a base; (2) a plurality of alignment and/or retention fixtures adhered to the base and having desired positions relative to one another; (b) a plurality of components mounted on the alignment structure in positions dictated by the alignment and/or retention fixtures, wherein one or more of the following conditions are met: wherein one or more of the following conditions are met: (1) the base and the alignment and/or retention fixtures are monolithic, (2) the alignment and/or retention fixtures comprise a material deposited on substantially a layer-by-layer basis, or (3) the alignment and/or retention fixtures are formed in a single process in their respective relative positions.

Further aspects of the invention will be understood by those of skill in the art upon reviewing the teachings herein. Other aspects of the invention may involve combinations of the above noted aspects of the invention. Other aspects of the invention may involve methods and/or apparatus that can be used in implementing one or more of the above aspects of the invention. These other aspects of the invention may provide various combinations of the aspects presented above as well as provide other configurations, structures, functional relationships, and processes that have not been specifically set forth above.

Preferred embodiments are directed to permanent or temporary alignment structures for receiving multiple components. The structures are preferably formed monolithically via a plurality of deposition operations (e.g. electrodeposition operations). The structures typically include two or more positioning features that control or aid in the positioning of components relative to one another, such features may include (1) positioning guides or stops that fix or at least partially limit the positioning of components in one or more orientations or directions, (2) retention elements that hold positioned components in desired orientations or locations, and (3) positioning and/or retention elements that receive and hold adjustment modules into which components can be fixed and which in turn can be used for fine adjustments of position and/or orientation of the components. The structures may also include elements that bring functionality beyond that of mechanical alignment and retention. Such functionality may involve electrical function, a thermodynamic function, optical or photonic function, and/or a mechanical function. Conductive paths may be provided on a structure to allow off-structure communication as well as on-structure communication. On structure communication may occur within single components, between single components and functional elements, or between multiple components with or without intermediate functional element enhancements.

BRIEF DESCRIPTION OF THE DRAWINGS

FIG. 12 depicts a schematic representation of an alignment and/or retention structure for receiving multiple components where the structure includes a preliminary alignment and/or retention fixture that can receive a secondary alignment and/or retention fixture which in turn can receive a component.

FIG. 13 depicts a perspective view of a first preferred protruding-type fixture along with a schematic representation of a component that can be located thereby.

FIG. 14 depicts a perspective view of a second preferred protruding-type fixture along with a schematic representation of a component that can be located thereby.

FIG. 16A depicts a perspective view of a fourth preferred protruding-type fixture along with a schematic representation of a component located thereby while

DETAILED DESCRIPTION OF EMBODIMENTS OF THE INVENTION

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
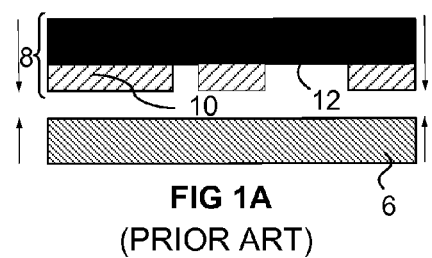
FIGS. 1A-1C schematically depict side views of various stages of a CC mask plating process, while FIGS. 1D-G schematically depict a side views of various stages of a CC mask plating process using a different type of CC mask.
Figure 1B:
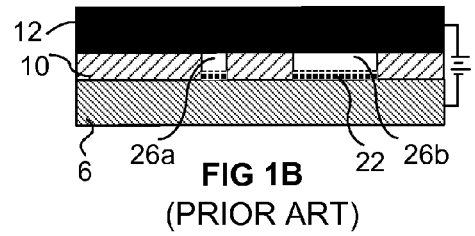
Figure 1C:
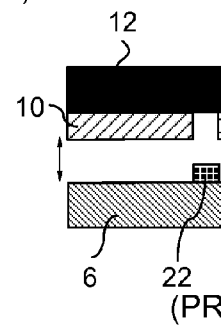
Figure 1D:
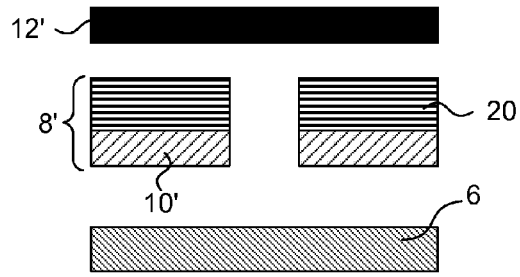
Figure 1E:
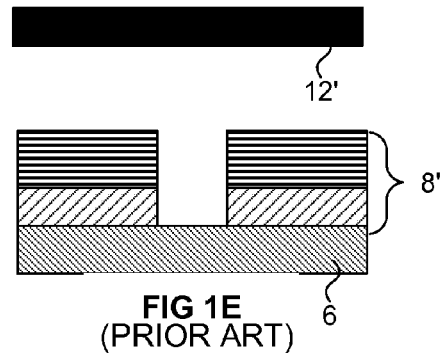
Figure 1F:
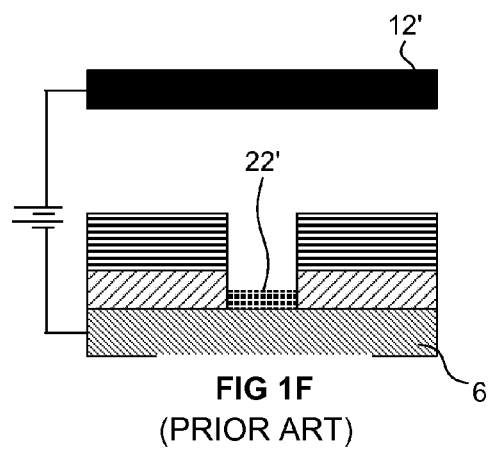
Figure 1G:
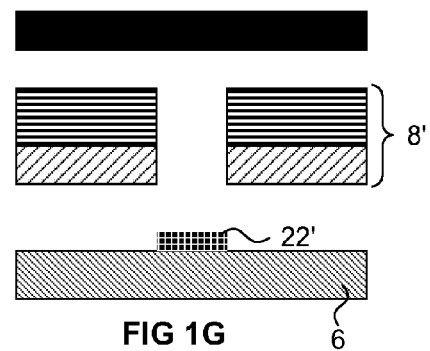
Figure 2A:
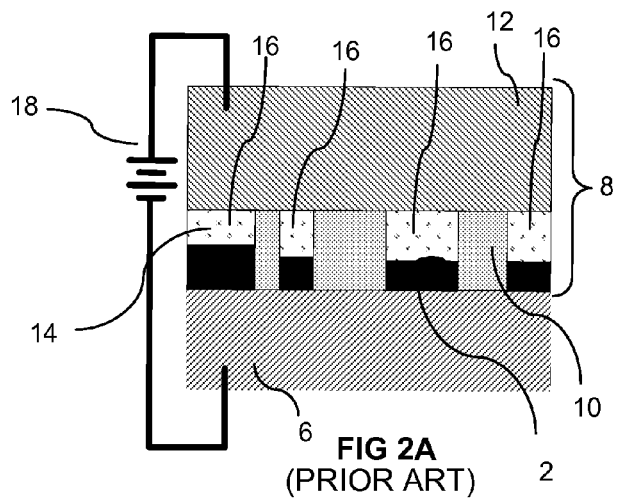
FIGS. 2A-2F schematically depict side views of various stages of an electrochemical fabrication process as applied to the formation of a particular structure where a sacrificial material is selectively deposited while a structural material is blanket deposited.
Figure 2B:
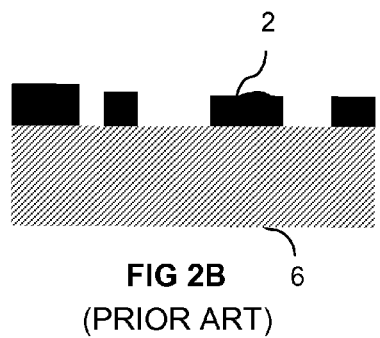
Figure 2C:
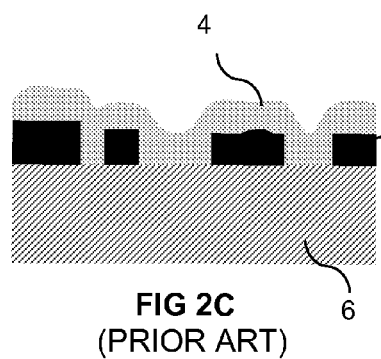
Figure 2D:
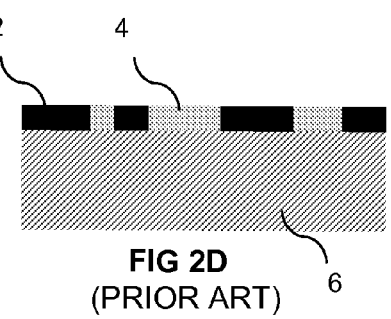
Figure 2E:
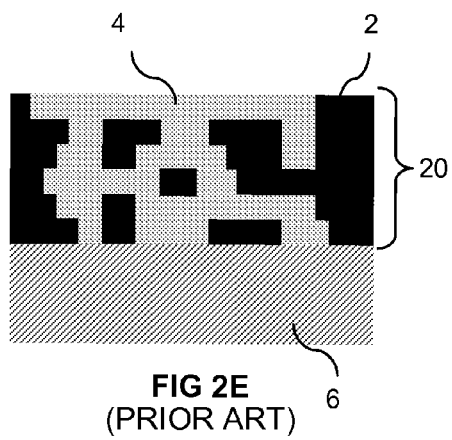
Figure 2F:
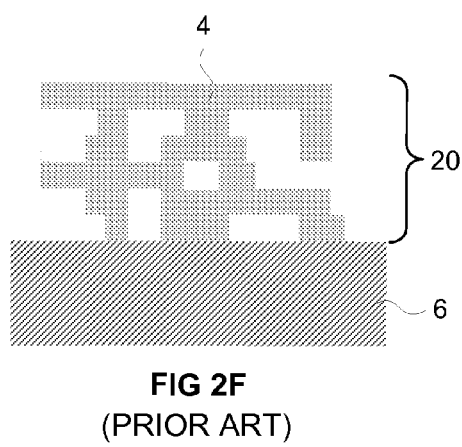
Figure 3A:
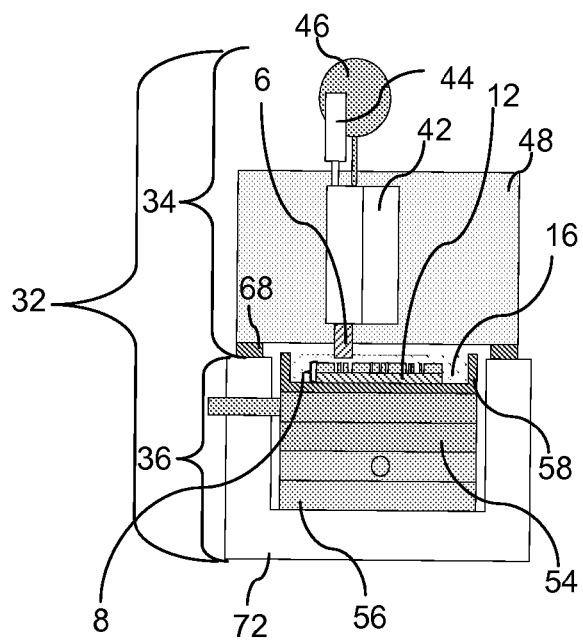
FIGS. 3A-3C schematically depict side views of various example subassemblies that may be used in manually implementing the electrochemical fabrication method depicted in FIGS. 2A-2F.
Figure 3B:
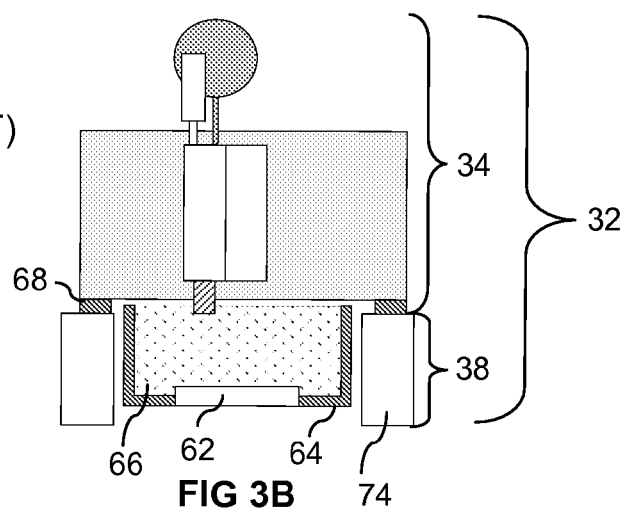
Figure 3C:
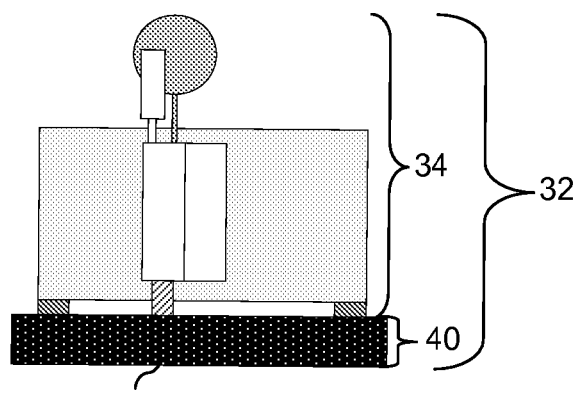
Figure 4A:
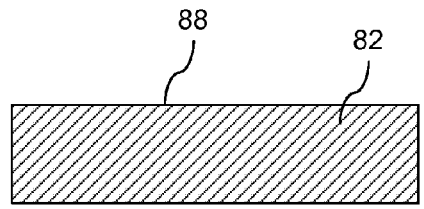
FIGS. 4A-4I schematically depict the formation of a first layer of a structure using adhered mask plating where the blanket deposition of a second material overlays both the openings between deposition locations of a first material and the first material itself.
Figure 4B:
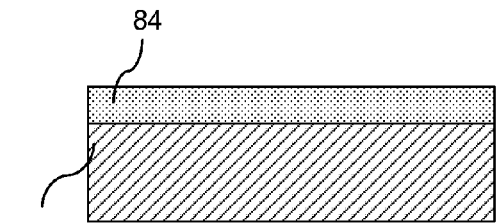
Figure 4C:
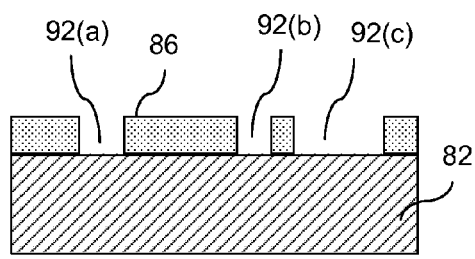
Figure 4D:
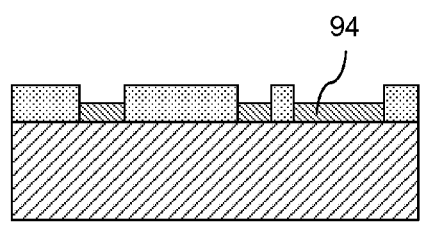
Figure 4E:
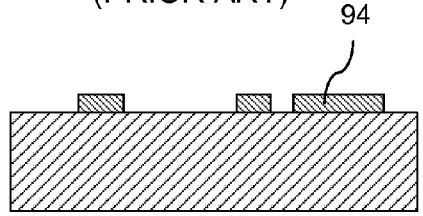
Figure 4F:
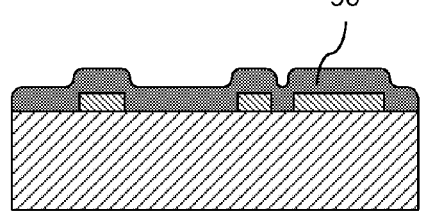
Figure 4G:
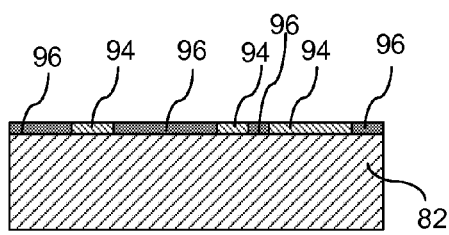
Figure 4H:
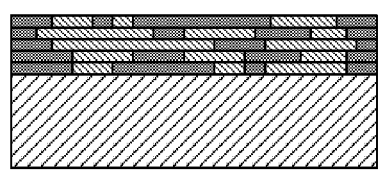
Figure 4I:
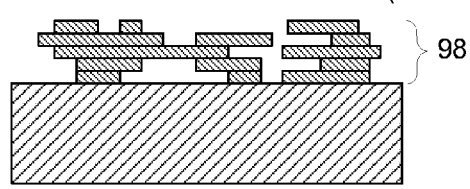

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Figure 5A:
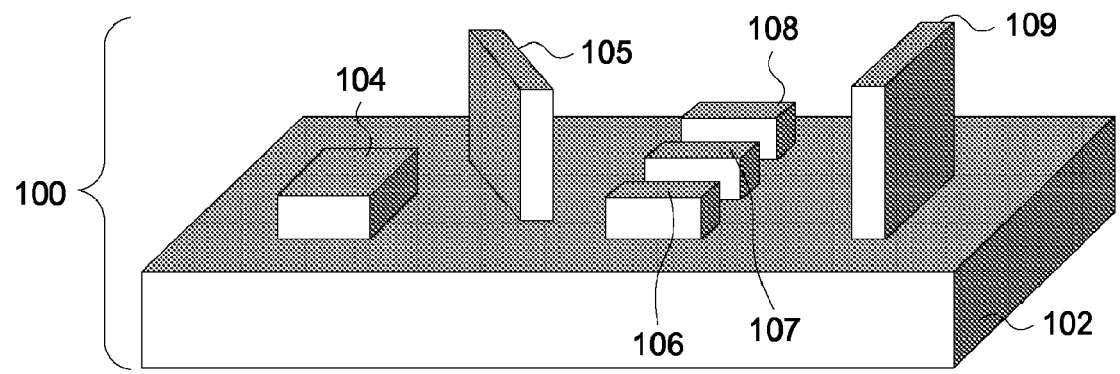
FIG. 5A depicts a schematic representation of an alignment and/or retention structure for receiving multiple components where alignment and/or retention fixtures protrude from a base.

FIG. 5A depicts a schematic representation of an alignment and/or retention structure 100 for receiving multiple components where alignment and/or retention fixtures 104-109 protrude from a base 102. In the example of FIG. 5A, boxes 104-109 represent the six alignment and/or retention structures that extend from a base plate 102. The fixtures may be configured, positioned, and oriented for acceptance of specifically sized and configured components for loading in specific orders and from specific orientations. As such, the fixtures may have different sizes, orientations, and configurations as exemplified in FIG. 5A. It should be understood (even though not depicted), the fixtures need not have a rectangular structure but may take on any structural configuration that is appropriate to the component or components to be aligned or retained. In the illustration of FIG. 5A, all structural features within the boxes may be considered part of the alignment structures themselves while those outside the boxes maybe considered part of the base.

Figure 5B:
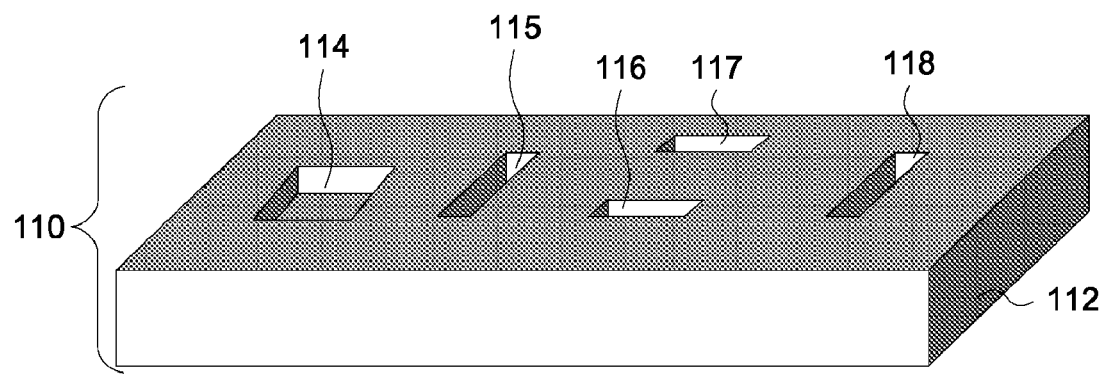
FIG. 5B depicts a schematic representation of an alignment and/or retention structure for receiving multiple components where alignment and/or retention fixtures are recessed into a base.

FIG. 5B depicts a schematic representation of an alignment and/or retention structure 110 for receiving multiple components where alignment fixtures 114-118 are recessed into a base 112. In the illustration of FIG. 5B, all structural features within the box-like depressions may be considered part of the alignment structures themselves while those outside the boxes maybe considered part of the base. As with protruding alignment fixtures recessed alignment fixtures may take on any appropriate configuration or orientation.

In some preferred embodiments the base need not have the substantially rectangular configurations as shown in the illustrations of the present applications, the configuration of the base may take on any form appropriate to a given situation. In the present application, the term "base" shall refer to any structure that connects two or more alignment fixtures together (unless more narrowly limited by the context) and not just the structural configuration depicted. For example, a base may be a single bar-like structure that connects two fixtures; it may be a rigid gird-like structure that connects two or more fixtures; it may not be planar but may have features that extend in three dimensions; it may not be a single structure that connects all fixtures but may be in the form of segmented elements that connect a only a portion of the fixtures; or the surfaces of what might be considered part of the fixtures themselves may function as a base if those surfaces join other fixtures.

Figure 6:
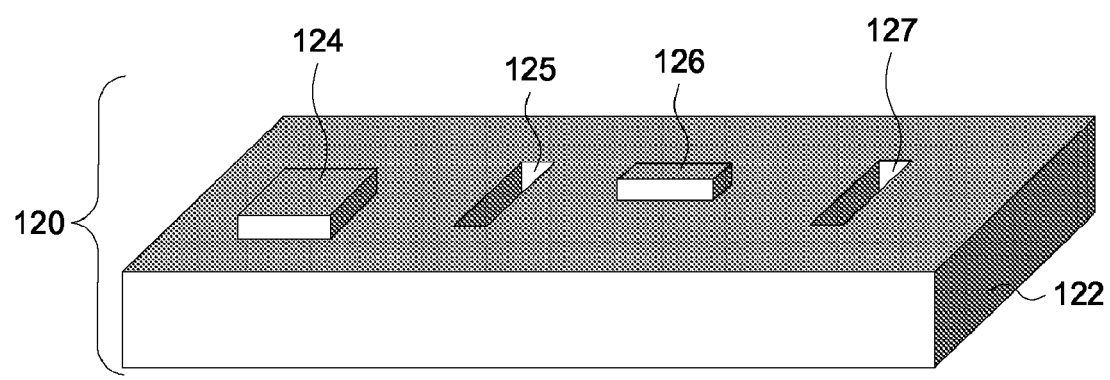
FIG. 6 depicts a schematic representation of an alignment and/or retention structure for receiving multiple components where some alignment and/or retention fixtures protrude from a base and other alignment fixtures are recessed into the base.

FIG. 6 depicts a schematic representation of an alignment and/or retention structure 120 for receiving multiple components where some alignment and/or retention fixtures 124 and 126 protrude from a base 122 and other alignment and/or retention fixtures 125 and 127 are recessed into the base 122. In other embodiments, alignment and or retention fixtures may be of a mixed nature in that a portion of fixtures may be recessed while another portion may protrude from a base.

Figure 7A:
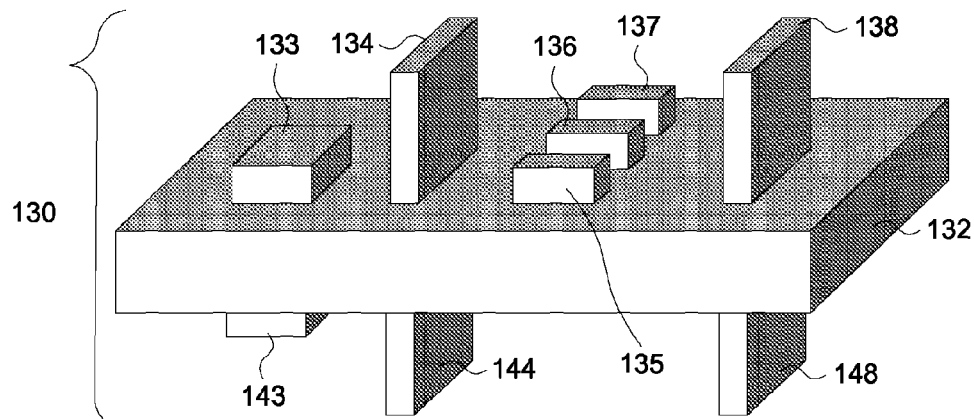
FIG. 7A depicts a schematic representation of an alignment and/or retention structure for receiving multiple components where some alignment and/or retention fixtures are located on an upper surface of a base and where other alignment and/or retention fixtures are located on a lower surface of the base.

FIG. 7 depicts a schematic representation of an alignment and/or retention structure 130 for receiving multiple components where some alignment and/or retention fixtures 133-138 are located on an upper surface of a base 132 and where other alignment and/or retention fixtures 143, 144, and 148 are located on a lower surface of the base.

Figure 8:
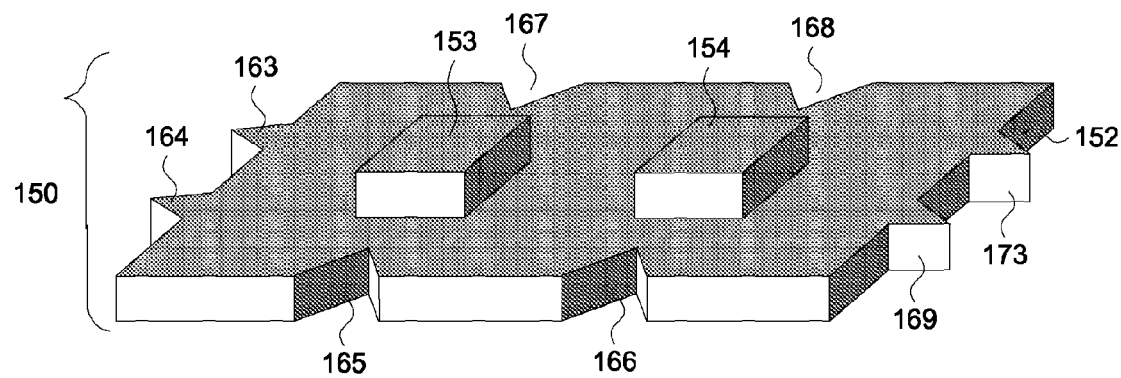
FIG. 8 depicts a schematic representation of an alignment and/or retention structure for receiving multiple components where the alignment and/or retention fixtures are located on an upper surface of a base and other alignment and/or retention fixtures are located on the sides of the base.

FIG. 8 depicts a schematic representation of an alignment and/or retention structure 150 for receiving multiple components where the alignment and/or retention fixtures 153 and 154 are located on an upper surface of a base 152 and other alignment and/or retention fixtures 163-169 and 173 are located on the sides of the base. As depicted fixtures 165-168 are recessed into the base, while 163, 164, 169, and 173 protrude from a nominal side surface of the base. One or more of the fixtures and most particularly one or more of the side fixtures 163-169, and 173 may be used in aligning the structure with second alignment and/or retention structure or with a package that is to receive the alignment and/or retention structure. The side fixtures may be used solely as alignment guides or may be used for retention purposes as well. Of course, in some preferred embodiments, side fixtures may take on different configurations and/or side fixtures may be used in conjunction with the various other alternative fixtures set forth herein. In some embodiments, fixtures on upper or lower surfaces of a base may be used in aligning a first alignment and/or retention structures with a second such structure.

Figure 9:
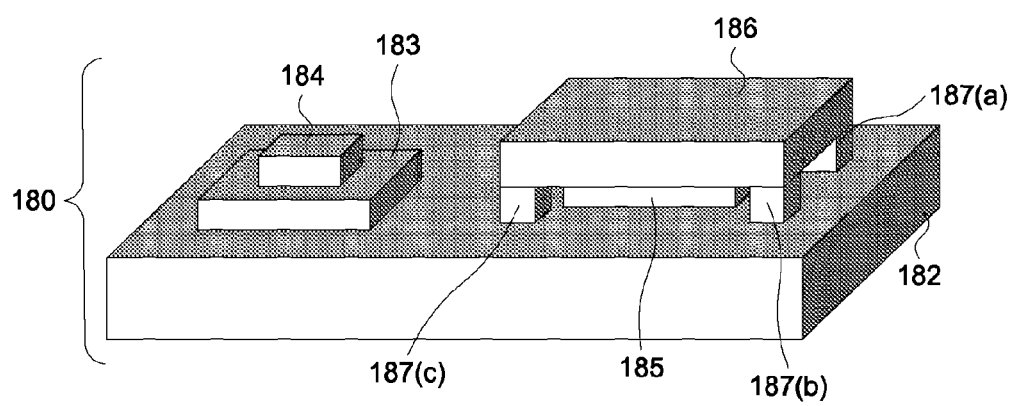
FIG. 9 depicts a schematic representation of an alignment and/or retention structure for receiving multiple components where alignment and/or retention fixtures are stacked upon one another.

FIG. 9 depicts a schematic representation of another preferred alignment and/or retention structure 180 for receiving multiple components where alignment and/or retention fixtures 184 and 186 are stacked above alignment and/or retention fixtures 183 and 185 respectively. Upper fixtures may be supported from lower fixtures (i.e. a portion of the lower fixture functions as a base for the upper fixture) as illustrated in conjunction with fixtures 184 and 183 or upper fixtures may be supported directly from extensions of the alignment fixture or extensions that protrude from the base as illustrated by extensions 187a-187c that support or at least help support fixture 186 directly from base 182. Of course, in alternative embodiments fixtures may be stacked within recesses that extend into the base and may also include further stacking above the base. In still other embodiments fixturing elements may be included as part of the packaging of previously loaded components. In some embodiments heat conductive pastes and the like may be used to achieve desired component to base properties.

Figure 10:
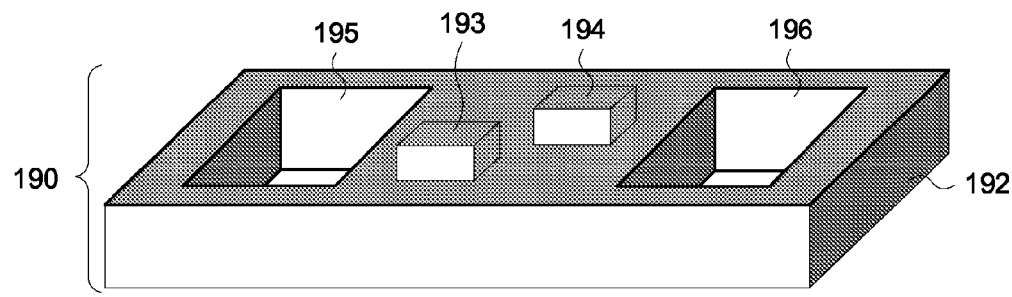
FIG. 10 depicts a schematic representation of an alignment and/or retention structure for receiving multiple components where some alignment and/or retention structures are formed on an upper surface of the base and openings extend through the base between its upper and lower surfaces.

FIG. 10 depicts a schematic representation of an alignment and/or retention structure 190 for receiving multiple components where some alignment and/or retention fixtures 193 and 194 are formed on an upper surface of a base 192 and openings 195 and 196 extend through the base from an upper to a lower surface. The openings that extend through the base may serve several functions: (1) they may include component alignment or retention fixtures for receiving components, such as when component placement and loading order requires loading of components from both sides, (2) they may form passageways through the base that allow communication of signals or material flow between upper and lower regions, e.g. optical signals, gas or liquid flow, and the like, or (3) they may perform some other design function, such as reducing material consumption, improving manufacturability, providing clearance for other structures, and the like. Fixtures and components may be located above or below openings. Such locations may aid in production or reception of signals or production of, receipt of, directing of, or controlling of material flow that moves through the opening. The openings through the base need not be orientated perpendicular to a plane of the base but may be orientated in any convenient or required manner. The openings may actually take the form of simple or complex two or three dimensional paths (e.g. manifolds and the like) that may direct signals or material flow in a desired pattern. In the case of EM signal flow, the openings may not be physical openings but may be physically obstructed with a medium that allows transmission of the desired signal, e.g. for optical signals a glass barrier may be located in the opening, and for RF or microwave signals an appropriate dielectrical may be located in a wave-guide or coaxial-type transmission line. Such obstructing materials may or may not be considered components mounted in a fixture. In Particular they may not be considered components when they are formed or built up along with the formation of the structure itself.

Figure 11A:
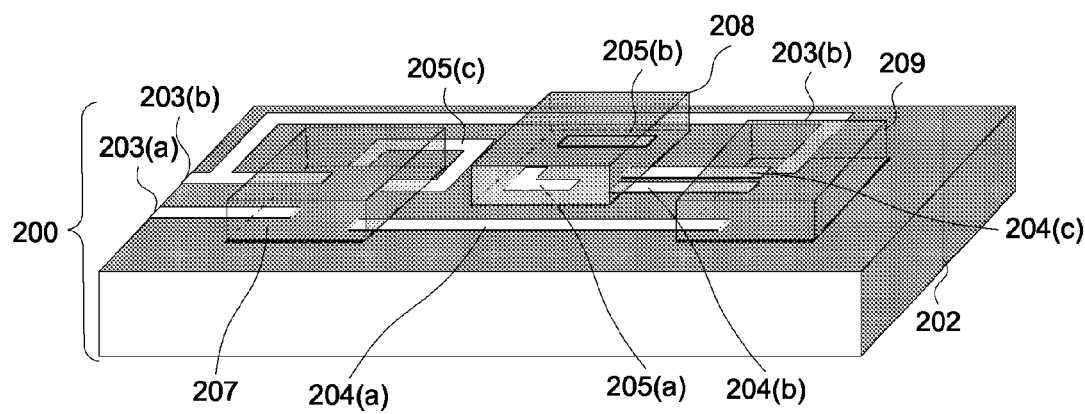
FIGS. 11A and 11B depict schematic representations of alignment and/or retention structures for receiving multiple components where the structures include conductive paths and/or other built-in functional structures or features.
Figure 11B:
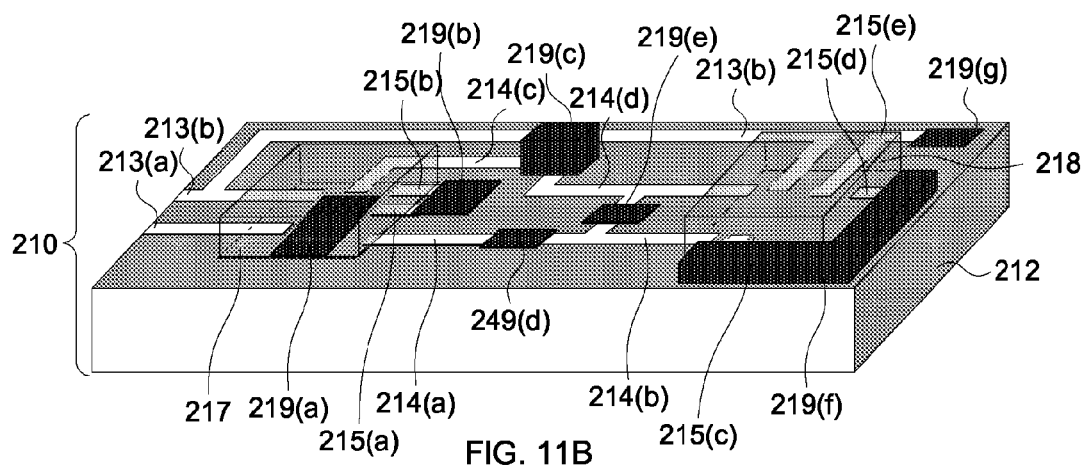

FIGS. 11A and 11B depict schematic representations of alignment and/or retention structures 200 and 210 for receiving multiple components where the structures include conductive paths and/or other functional structures, elements, or devices built into bases 202 and 212. FIG. 11A depicts alignment and/or retention fixtures 207-209 located on the upper surface of base 202. The upper surface of the base is depicted as having off-structure communicating conductive paths 203a and 203b, on-structure component-to-component communicating paths 204a-204c, and on-structure paths for communicating between different portions of a single components 205a-205c. FIG. 11B depicts alignment and/or retention fixtures 217 and 218 located on the upper surface of base 212. The upper surface of the base 212 is depicted as having off-structure communicating conductive paths 213a and 213b, on-structure component-to-component communicating paths 214a-214d, on structure paths for communicating between different portions of a single component 215a-215e, and built-in functional elements 219a-219g.

Paths 203a, 203b, 213a, and 213b allow communication from the components that will be associated with their respective structures to devices or components that are not associated with these respective structures. The signals along these paths may take the form of a simple power input or output, or signal input or output, or some combination of both. As path 203b connects fixtures 207 and 209 and as path 213b connects fixtures 217 and 218, on structure communication between components may also occur.

As indicated, paths 205a-205c and 215a-215e make external connections between different portions of a single component. This type of connection may occur within the boundary of an alignment and/or retention fixture or it may extend beyond such a boundary. Such connections can be useful for a variety of reasons. As indicated by path 215a and 215b and also by 215c and 215d, such paths may allow the connection to be made via functional elements such as 219b and 219f. These functional elements may be formed along with the formation of the base and fixtures. These elements/structures may introduce many different functionalities, for example resistance, capacitance, inductance, wave shaping (e.g. coaxial transmission or filtering), testing functionality, or monitoring functionality, and the like. Additional embedded functional elements (such as 219a) may not be connected to other structures or components by electrically conductive paths but instead provide some other functionality such as, for example, production of magnetic fields, enhanced heat flow (e.g. via heat pipes), or enhanced reflectivity.

In alternative embodiments, the functional elements may be connected conductively, capacitively, or inductively to off-structure devices. In still other embodiments the functional elements may be formed on the fixtures instead on the bases. Furthermore, conductive paths may run partly or completely on or into the alignment and/or retention fixtures. In some embodiments, portions of the base, or substantially the entire base, and/or portions of the alignment and/or retention fixtures, or substantially the entire fixtures, may be formed from a dielectric material with the exception of the conductive paths or functional elements that require conductive materials. In other embodiments, the bases and the fixtures may be primarily formed from a conductive material with only a relatively thin region of dielectric separating the conductive paths from the rest of the conductive material. In still further alternative embodiments, the conductive paths and/or functional components may be completely embedded within dielectric portions of the base or within dielectric portions of the fixtures with the exception of those locations where contact must be made. In other alternative embodiment on surface conducting paths may be coated or otherwise shielded by a dielectric.

FIG. 12 depicts a schematic representation of an alignment and/or retention structure 230 for receiving multiple components where the structure includes a preliminary alignment and/or retention fixture 233, in base 232, that can receive a secondary alignment and/or retention fixture 234 which in turn can receive a component 236. The depicted structure also contains an additional alignment and/or retention fixture 235. In alternative embodiments multiple primary and secondary fixture pairs may exist. In still further embodiments even tertiary or higher order groups of fixtures may exist. Such fixture groups may be useful to allow height or orientation changes in component fixturing to occur. Such versatility might be helpful in allowing a single alignment and/or retention structure to be used in multiple applications where differing components or numbers of components might be involved. In some alternative embodiments secondary fixtures may allow multiple components to be attached. In some other alternative embodiments the secondary fixtures may make conductive paths that connect to conductive paths on the primary fixtures.

FIG. 13 depicts a perspective view of a first preferred protruding-type alignment (or positioning) fixture 240 along with a schematic representation of a component 249 that can be located thereby. The fixture of FIG. 13 includes four alignment elements 243a-243d that hold the corners of component 249. As illustrated, the alignment elements 243a-243d do not necessarily aid in guiding the component into the fixture though they do ensure that once the component is lowered completely into the fixture it is properly located in all three-dimensions (assuming the fixture is mounted from below by the base whose surface functions as part of the fixture). In alternative embodiments, fewer or more fixturing elements may be used and different configurations (e.g. having different heights and widths) may be used. In particular, if a component has particular features, the fixturing elements may be sized and positioned appropriately to either catch or avoid the features. In still further alternatives, tapering of the inside upper edges of the alignment elements can help guide the component into the fixture and likewise tapering of the lower edges of the component can also help in the guiding process. In some alternative embodiments the fixtures may include vertical stops as well. In the depicted embodiment frictional forces may be used to help retain the component in the fixture. If it is desired that the component be firmly affixed in the fixture, alternative embodiments may use various techniques for securing the component and the fixture, for example: (1) a desired type of adhesive may be located between the component and a base (not shown) on which the fixture sits, (2) an adhesive may be located between the fixture elements and the components, (3) cooling of the component and/or heating of fixture may be used to temporarily increase or create a desired size differential between the component and the fixture to allow tightly fitting pieces to be positioned where after temperature equalization will cause a more intimate mating and retention of the pieces; (4) solder or the like may be selectively applied to desired locations (e.g. electrical contact regions) or blanket deposited if shorting is not an issue so that after positioning, melting and resolidification of the solder may cause bonding as well as ensuring reliable electrical contact, (5) other conductive and/or non-conductive meltable or temporarily flowable or deformable materials may be used in a manner analogous to that noted above for solder, (6) packaging of the component(s)/structure(s) may involve a partial or complete embedding of the components in a selected material within a package that includes the structures, or (7) packaging of the component(s)/structure(s) may involve the used of an enclosure that holds the component(s)/structure(s) together.

FIG. 14 depicts a perspective view of a second preferred protruding-type fixture 250 along with a schematic representation of a component 259 that can be located thereby. The fixture of FIG. 14 includes four alignment elements 253a-253d that hold the sides of component 249. As with FIG. 13, as depicted, the alignment elements 253a-253d do not necessarily aid greatly in guiding the component into the fixture. The alternatives noted above with regard to FIG. 13 are also applicable to the embodiment illustrated in FIG. 14 and are largely applicable to the other embodiments explicitly set forth below as well as other embodiments that will be apparent to those of skill in the art that have studied the teachings herein.

Figure 15:
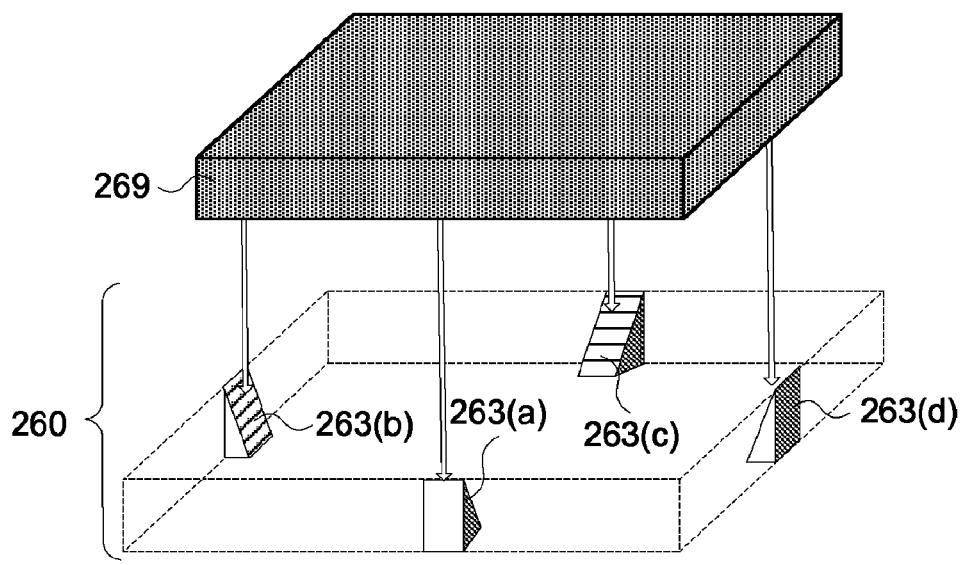
FIG. 15 depicts a perspective view of a third preferred protruding-type fixture along with a schematic representation of a component located thereby.

FIG. 15 depicts a perspective view of a third preferred protruding-type fixture 260 along with a schematic representation of a component 269 that may be located thereby. Fixture elements 263a-263d not only properly locate the component but due to their tapered configuration they also can help guide the component into the fixture. In alternative embodiments, the tapering need not be uniform but may be greater at the top of the fixture elements. In alternative embodiments the tapering may reduce to nothing as the width of the opening offered by the alignment structure approaches the width of the component. In some alternatives, upper surfaces of the bases may function as a vertical stop or additional elements or stop features may be considered part of the fixture itself.

Figure 16A:
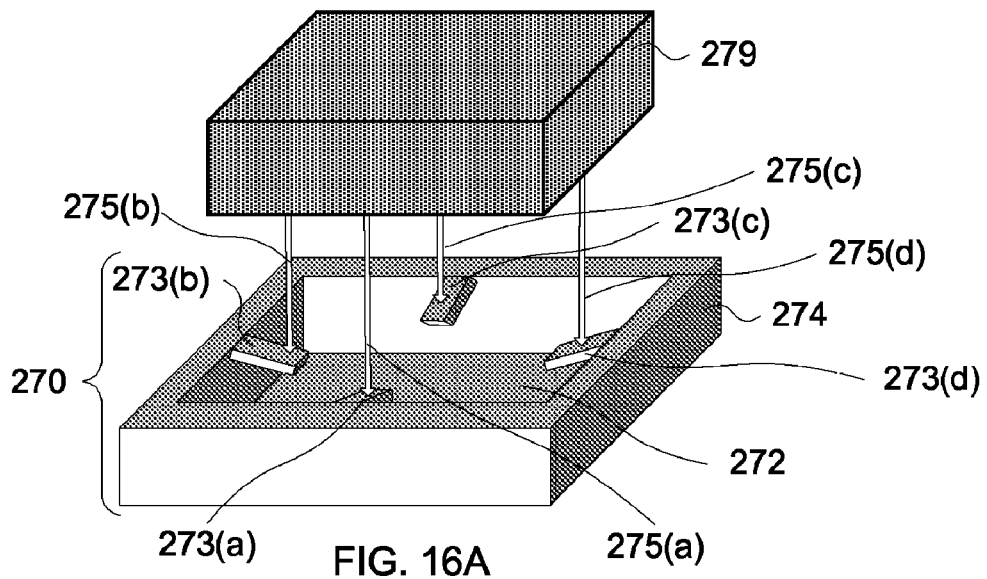
Figure 16B:
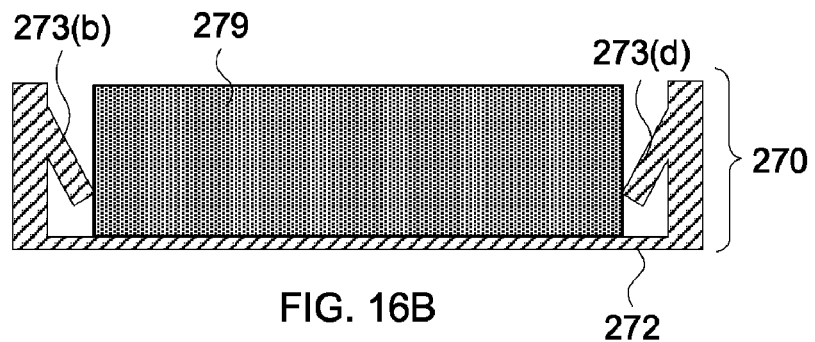
FIG. 16B depicts a side view of the component loaded into and retained by the fixture of FIG. 16A.

FIG. 16A depicts a perspective view of a fourth preferred protruding-type fixture 270 along with a schematic representation of a component 279 located thereby while FIG. 16B depicts a side view of the component 279 loaded into and retained by the fixture 270. FIG. 16A illustrates a component 279 located above an alignment and retention fixture. The down-facing arrows 275a-275d indicate the movement of component that may be used to load the component into the fixture. The fixture 270 includes a perimeter wall 274 and four inward-facing, downward-sloping side retention tabs 273a-273d. A portion of the base 272 of the alignment structure can also be seen. As the component is loaded into the fixture the tabs 273a-273d bend down sufficiently to allow the component to enter the fixture but due to their at least partial elastic deformation they exert an inward pointing forces onto the component which tends to center the component in the fixture and hold the component in place friction between the tabs and components inhibit an upward backing out of the component from the fixture.

In some alternative embodiments, the components may have sets of side slots that engage the tabs 273a-273d, or the like, which may be useful in helping the desired positions of the component and fixture. In other alternatives, additional tabs may be used and/or the tab structure may be varied (e.g. tab width and thickness may vary (e.g. decrease) with length from the perimeter wall 274. In other embodiments, the perimeter wall may be replaced by individual tab supports. In still other embodiments, the retention tabs may enter indentations in the component side walls to further aid in securing the component into a desired position relative to the alignment/retention structure.

Figure 17A:
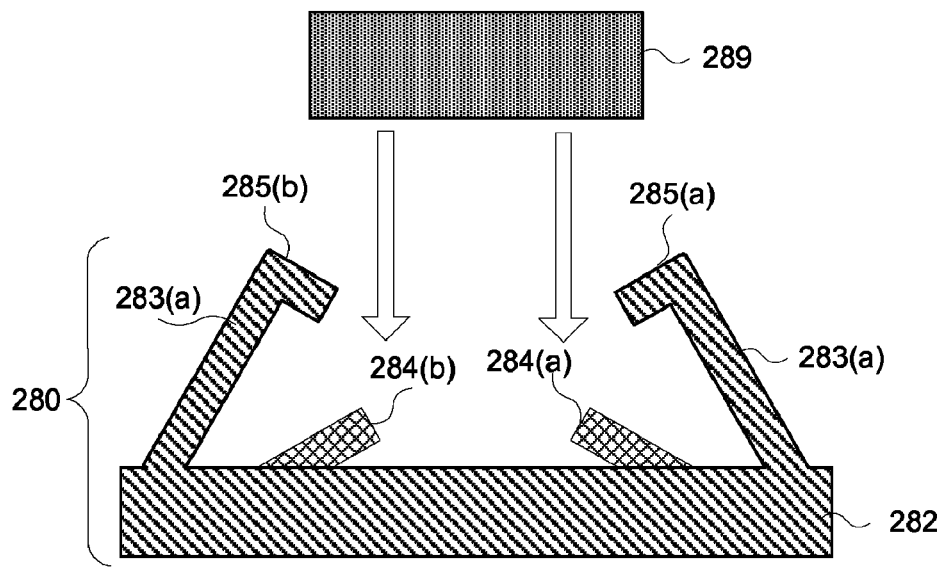
FIGS. 17A and 17B depict side views of a fifth preferred protruding-type fixture along with a schematic representation of a component located and retained thereby.
Figure 17B:
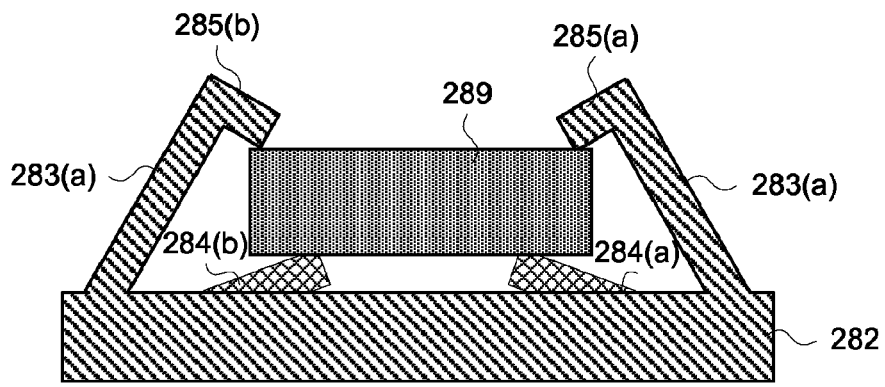

FIGS. 17A and 17B depict side views of a fifth preferred protruding-type fixture 280 along with a schematic representation of a component 289 located and retained thereby. The fixture includes retention arms 283a and 283b along with compression elements 284a and 284b. As the component 289 is push down into the fixture, retention arms 283a and 283b are forced open. As the component is pushed deeper into the fixture, the bottom of the component encounters the compression elements and pushes them downward. As downward motion continues, the upper portion of the component clears the retention arms 283a and 283b and they slide inward such that fingers 285a and 285b become located above the upper surface of the component. When the downward loading force is removed, the compression elements push the component upward causing fingers 285a and 285b to grasp the upper surface of the component such that the component is firmly held between the retention arms and compression elements. As illustrated both the retention arms and the compression elements are mounted on or formed integral with a base 282 of the alignment and retention structure.

In some embodiments one or more of the compression elements may be electrical conductors and contactors and/or one or more of the retention arms may be electrical conductors and contactors. The elements that are electrical contactors may be formed of any desired conductive material (e.g. copper or a gold plated material) and they may be connected to conductive paths on or within the base. In some embodiments, additional structures may be added to aid in guiding the component into the fixture (see for example elements 386a and 386b of FIG. 27A). In some embodiments more than two compression springs and retention arms may be used, the springs and arms may be paired or otherwise grouped or there may be different numbers of each. In some embodiments, the compression springs may be configured differently, such as for example, like those indicated in FIG. 17C.

Figure 17C:
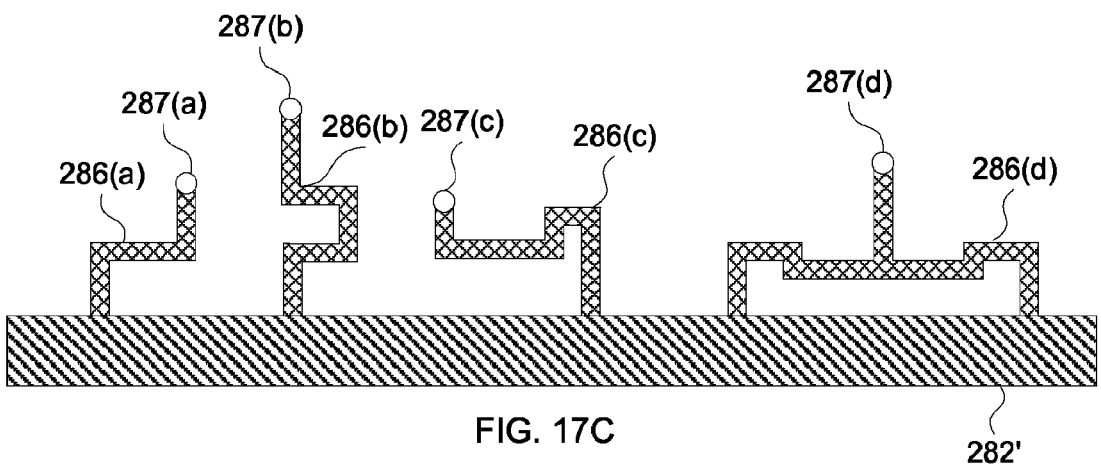
FIG. 17C depicts a side view of several alternative compressive structures that can be used in an alignment and retention fixture such as that depicted in FIGS. 17A and 17B.

FIG. 17C depicts four examples of different alternative configurations 286a-286d with each mounted on a base 282'. Each of the alternative configurations depicted in FIG. 17C may have a contact region made from a different material as indicated by elements 287a-287d (particularly if used as an electrical contractor). In some embodiments, instead of retention arms that hold a component from a surface perpendicular to the loading direction (e.g. top surface) retention tabs (similar to those shown in FIGS. 16A and 16B may be used that hold the components on a surface that is more parallel to the direction of loading (e.g. the side surfaces). In still further alternatives a single compression element or retention arm may have more than one element or finger that contacts the component. In still other embodiments, components may have slots or indentations on their upper and/or lower surfaces for engaging the fingers and/or compression elements. In still other embodiments fixtures configurations may be used that allow for spring based loading and spring based release. In even further embodiments base 282 may have a hole through it to allow signal or material access to the lower surface of the component.

Figure 18A:
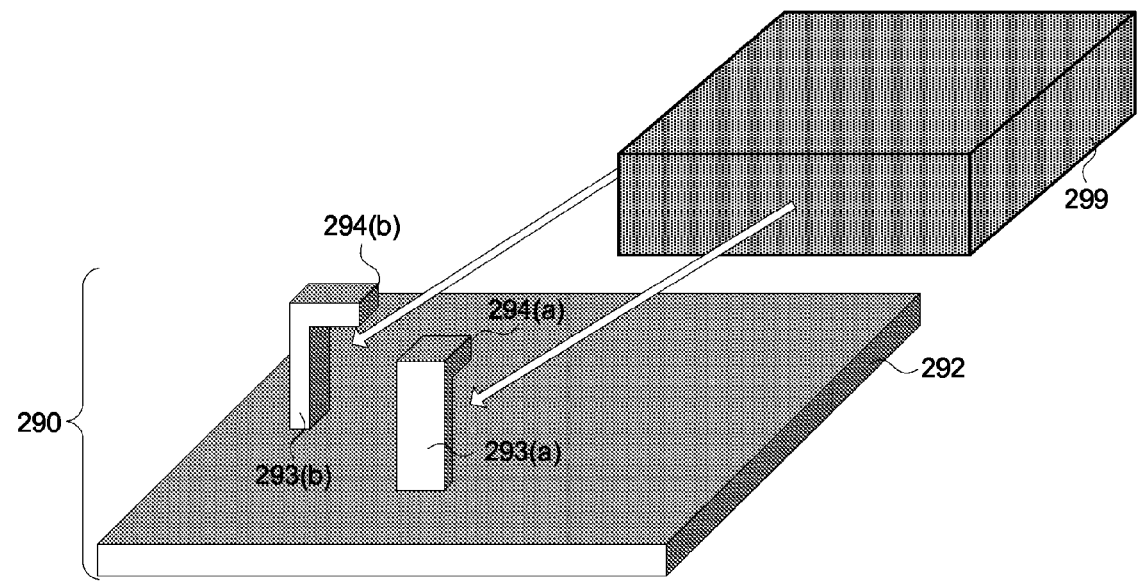
FIGS. 18A and 18B depict perspective views of a seventh protruding-type fixture along with a schematic representation of a component located thereby.
Figure 18B:
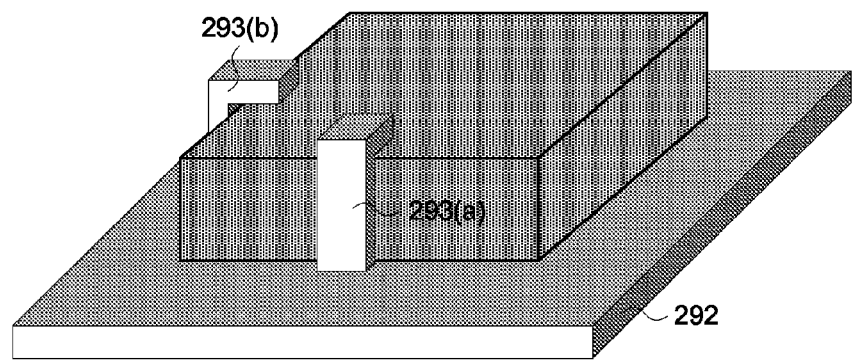

FIGS. 18A and 18B depict perspective views of a seventh protruding-type fixture 290 along with a schematic representation of a component 299 located thereby. In FIG. 18A a component 299 is depicted separate from a two stop 293a and 293b alignment fixture 290 that is mounted on a base 292. The component is loaded into the fixture so that two of the sides are caught and held by the two stops 293a and 293b. The two stops constrain the component in a first direction along both of the two horizontal axes and in the vertical direction. A rounding of the bottom of the fingers 294a and 294b of stops 293a and 293b and/or of the upper portion's of the component that engage the stops may lead to easy loading of the component into the fixture. FIG. 18B depicts the loaded fixture/component combination and as described herein elsewhere, various methods may be used to retain the component in the fixture as desired.

Figure 19A:
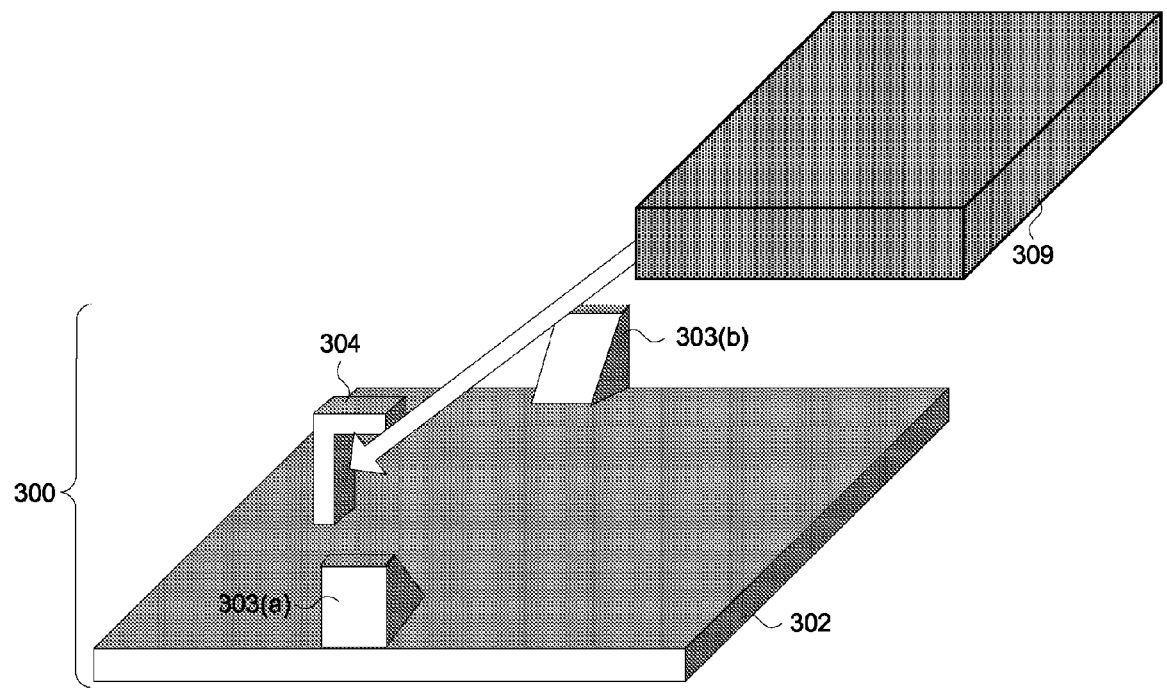
FIGS. 19A and 19B depict perspective views of an eighth preferred protruding-type fixture along with a schematic representation of a component located thereby.
Figure 19B:
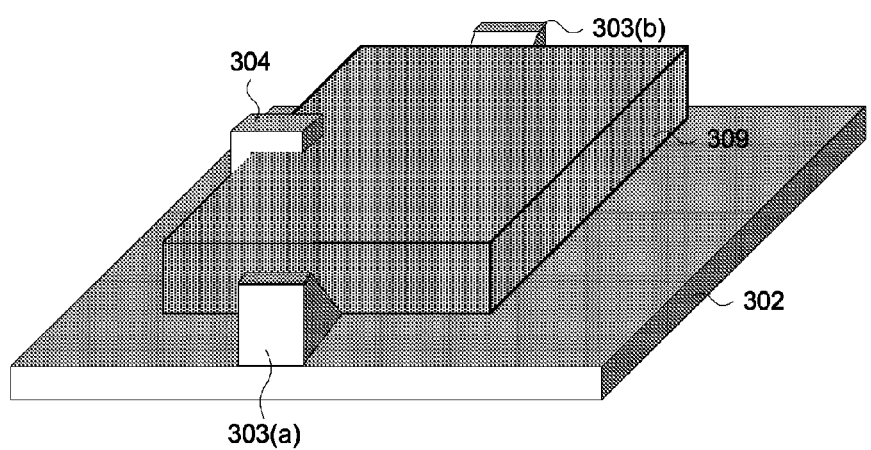

FIGS. 19A and 19B depict perspective views of an eighth preferred protruding-type fixture 300 along with a schematic representation of a component 309 located thereby. The alignment fixture 300 sits on base 302 and includes two guides 303a and 30b along with a stop 304 whose upper surface is a hook to constrain vertical movement of one end of a component 309 that is loaded into the fixture. From the teachings herein various alternative configurations of this embodiment will be apparent to those of skill in the art. For example, a guide opposite to the stop may be added. FIG. 19B depicts the loaded fixture/component combination.

Figure 20A:
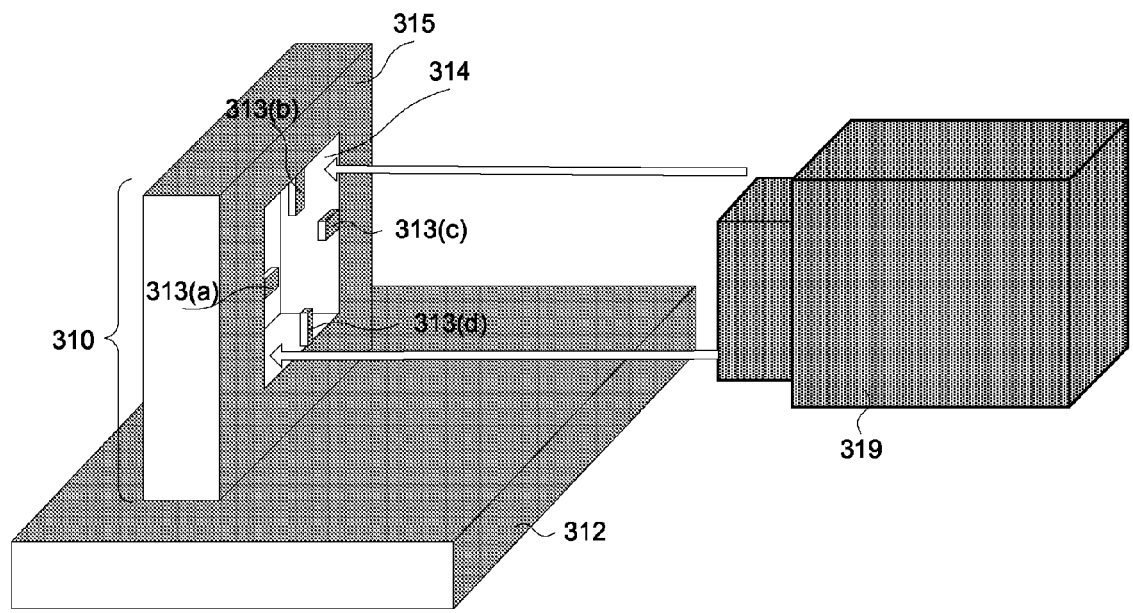
FIGS. 20A and 20B depict perspective views of a ninth preferred protruding-type fixture along with a schematic representation of a component located and retained thereby.
Figure 20B:
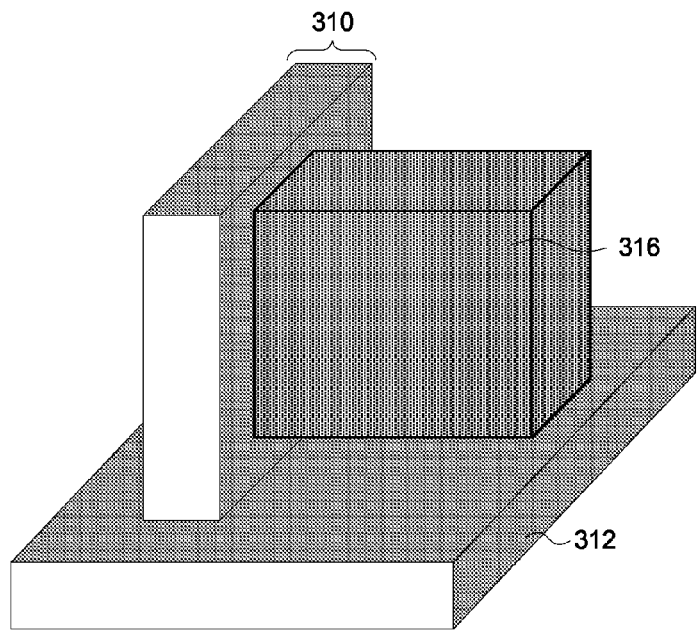

FIGS. 20A and 20B depict perspective views of a ninth preferred protruding-type fixture 310 along with a schematic representation of a component 319 located and retained thereby. The alignment fixture 310 is attached to a base 312. Though the alignment fixture protrudes from base 312, it may be considered a recessed fixture in that it includes an opening 314 through a rectangular block 315 (particularly if the block is considered to be part of the base). The alignment fixture 310 also includes retention tabs 313a-313d. The retention tabs are used to hold a component in much the same way the retention tabs of FIGS. 16A and 16B did. FIG. 20B depicts the loaded fixture/component combination. Various alternatives as discussed herein before and herein after may be used in conjunction with this embodiment.

Figure 21:
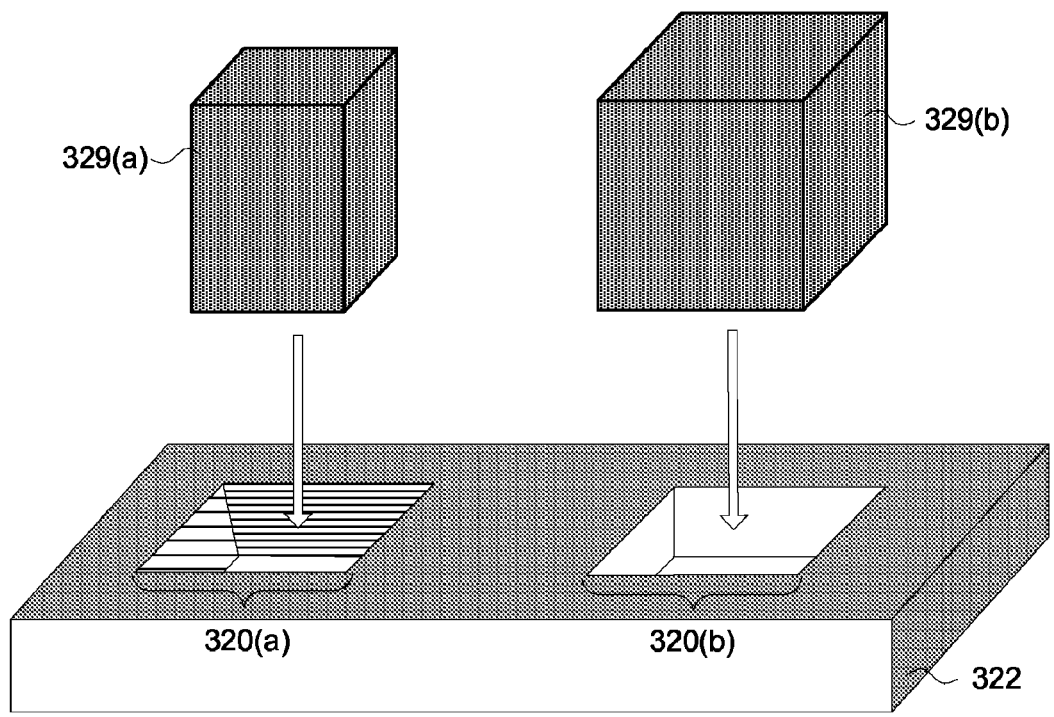
FIG. 21 depicts a perspective view of a first and second preferred recessed-type fixture along with a schematic representation of a component that can be located thereby.

FIG. 21 depicts a perspective view of within a base 322 first and second preferred recessed-type fixtures 320a and 320b respectively along with a schematic representation of components 329a and 329b that can be located thereby. Fixture 320b is a simple straight walled fixture which in many respects is similar to the fixtures of FIGS. 13 and 14. Fixture 320a is a sloped wall fixture which in many respects is similar to the fixture of FIG. 15. The embodiment of fixture 320a may be enhanced by modifying the slope of the walls so that, near the upper surface, the slope is angled or rounded so as to help guide the component into the fixture. As the component moves deeper into the fixture it may encounter more vertical and even completely vertical walls where the dimension of the opening within the walls is such as to allow accurate positioning and orientation of the component and potentially to retention of the component as well.

Figure 22:
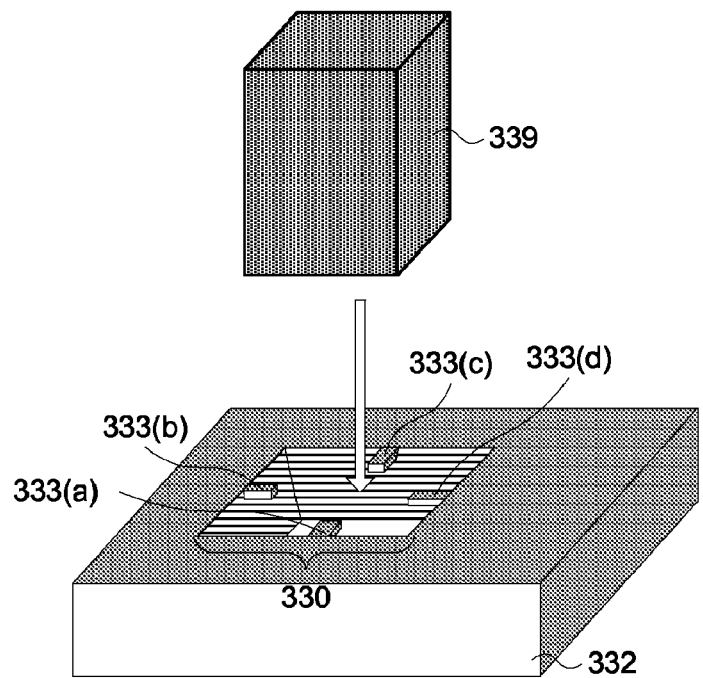
FIG. 22 depicts a perspective view of a third preferred recessed-type fixture along with a schematic representation of a component that can be located and retained thereby.

FIG. 22 depicts a perspective view of a third preferred recessed-type fixture 330 within a base 332 along with a schematic representation of a component 339 that can be located and retained thereby. The fixture of FIG. 22 is similar to those of FIGS. 16 and 20A with the exception that the walls surrounding the opening of the fixture are sloped to help center and ensure proper orientation of the component once it is loaded into the fixture. The fixture also includes retention tabs 333a-333d. In some alternative embodiments the fixtures of FIGS. 21 and 22 may be supplemented by protruding elements that help guide and orient the component and/or that help retain components in the fixtures.

Figure 23A:
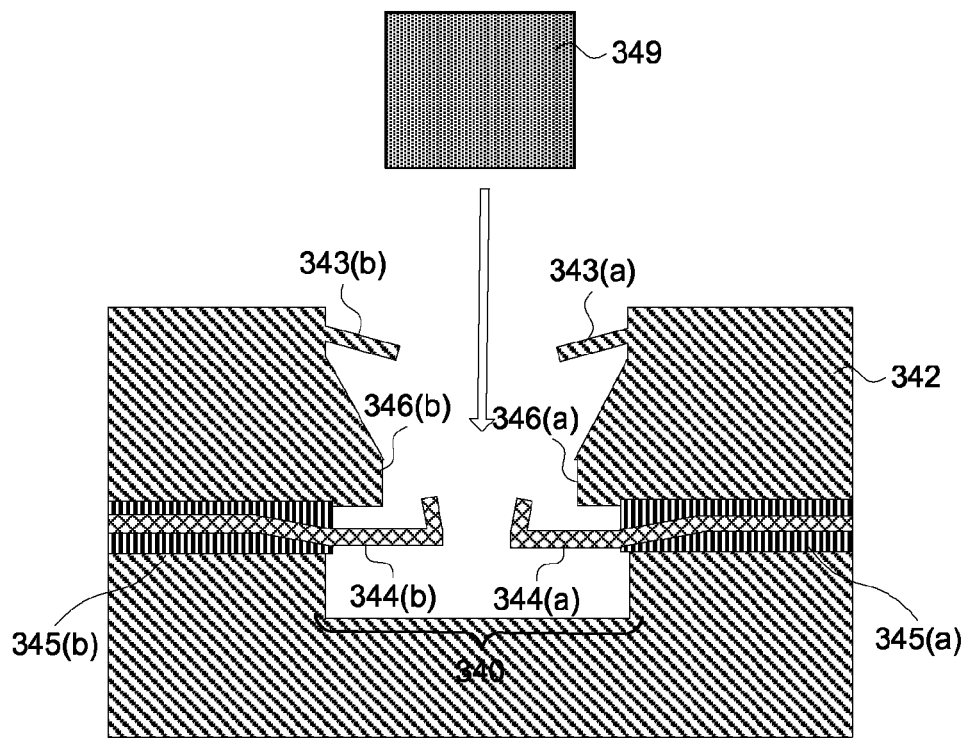
FIGS. 23A and 23B depict side views of an fourth preferred recessed-type fixture along with a schematic representation of a component located and retained thereby.
Figure 23B:
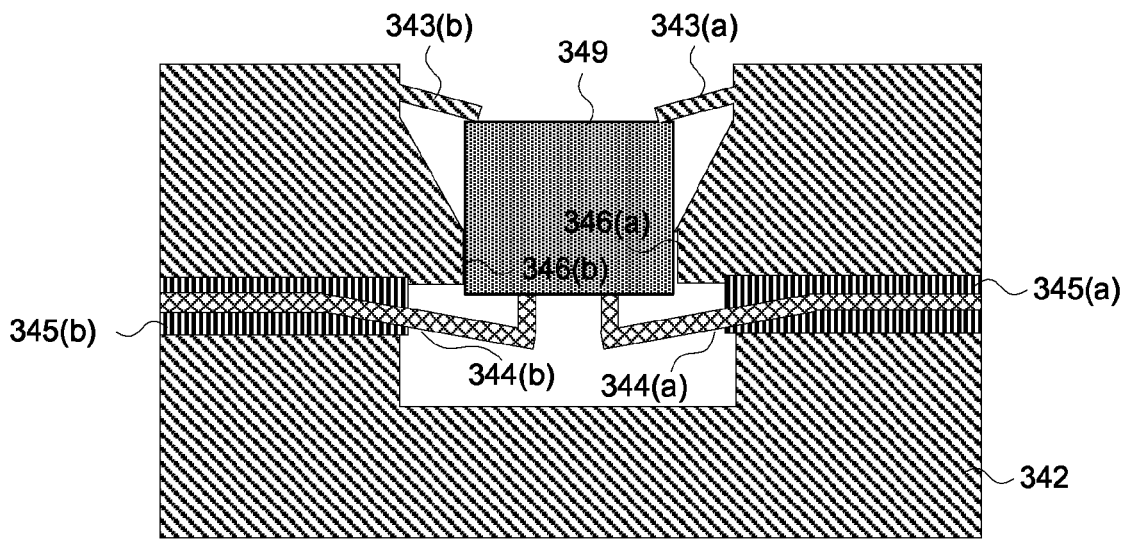

FIGS. 23A and 23B depict side views of an fourth preferred recessed-type fixture 340 along with a schematic representation of a component 349 located and retained thereby. Functionally the fixture of FIGS. 23A and 23B is similar to that of FIG. 17A but several distinctions exist. The fixture of FIGS.

23A and 23B include guide structures 346a and 346b that help ensure the component is properly oriented and located as it seats against spring elements 344a and 344b and as it is retained by elements 343a and 343b. In FIGS. 23A and 23B spring elements 344a and 344b may be electrical contactors that are isolated from a conductive base 342 by insulators 345a and 345b. Some of the elastic nature of spring elements 344a and 344b may result from an elastomeric nature of the insulating material of 345a and 345b. In some alternative embodiments, the base 342 may be formed from a dielectric material in which case a dielectrical material 345a and 345b may not be necessary. In embodiments where the component 349 is an RF or microwave component, conductors 344a and 344b surrounded by material 345a and 345b and a grounded conductor 342 may function as a coaxial transmission lines for any RF or microwave signals generated. In some embodiments, the coaxial attributes of the contactors may be extended by extending the dielectric and a surrounding conductive shield closer to the ends of conductors 344a and 344b. In particular, it is preferred that the dielectric and conductive shield not detrimentally reduce the elastomeric nature of conductors 344a and 344b.

Figure 24:
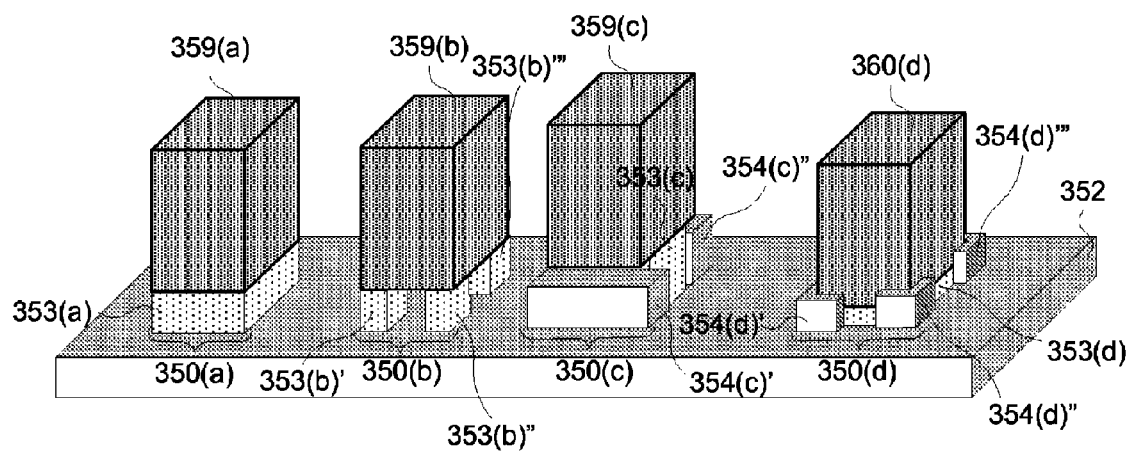
FIG. 24 depicts a perspective view of a portion of an alignment and retention structure that includes four variations of fixtures and associated components where the components may be mounted and then moved relative to the rest of the structure so that precision positional adjustments may be made beyond those associated with the initial mounting.

FIG. 24 depicts a perspective view of a portion of an alignment and retention structure that includes four variations of deformable fixtures 350a-350d, mounted on a base 352, along with associated components 359a-359d. The components are mounted on elements 353a, 353b'-353b''', 353c, and 353d and then moved relative to the rest of the structure so that precision positional adjustments may be made beyond those associated with the initial mounting. Elements 353a-353d may be a solder-like material or other low melting temperature material and particular a material of sufficiently low softening temperature that the material may be deformed without damaging the components 359a-359d. Component 359a may be mounted and initially bonded to material 353a by heating the material. In some embodiments the meltable material may be formed with or otherwise attached to the base prior to mounting the components. In other embodiments the meltable material may be attached to the component and thereafter the combination attached to the base. The position of component 359a may be finely adjusted in all three dimensions and in all orientations by grasping the component and softening material 353a and then adjusting the component's position while monitoring a desired alignment parameter. After the desired alignment is obtained the material 353a is cooled and allowed to fix the component in its desired precision position. If material 353a shrinkage causes misalignment upon solidification the extent of misalignment can be monitored and appropriate offset positioning used so that final positioning is correct.

Component 359b may be similarly adjusted in all three dimensions and in any orientation. Component 539c is bounded from below by protrusions 354c' and 354c''. These protrusions may be used to set the lowest vertical height of the component and the orientation of the component relative to a vertical axis. Upon softening the material 353c, the component may be pushed down against the block (or even potentially raised slightly if desired) and then the horizontal position and orientation may be set. Component 353d may be moved up and down vertically by softening material 353d and potentially its orientation with respect to a vertical axis changed slightly (depending on the restriction dictated by the fixture elements 354d'-354d''') but its horizontal position and orientation is largely fixed by fixture elements 354d'-354d'''.

In some embodiments a single component will be adjustable via a softenable or meltable material while in other embodiments a given alignment structure may have multiple components that will be adjustable in such a manner. When multiple components are adjustable in such a manner, and not all such components will be positioned and oriented simultaneously, then it may be appropriate to tailor the adjustment process to ensure that initial bonding or adjustments of a second or subsequent component do not disturb the bonding or adjustment or previously mounted or finely aligned components. This may be done by using materials with different softening temperatures and mounting the components and adjusting the components associated with the highest softening temperature first. Alternatively, if the heating of the material is isolated sufficiently to the alignment element associated with a single component, a single material may be used and adjustment may occur in any desired order or even in an incremental order. As with the other embodiments various alternatives will be understood by those of skill in the art upon review of the teachings herein.

Figure 25:
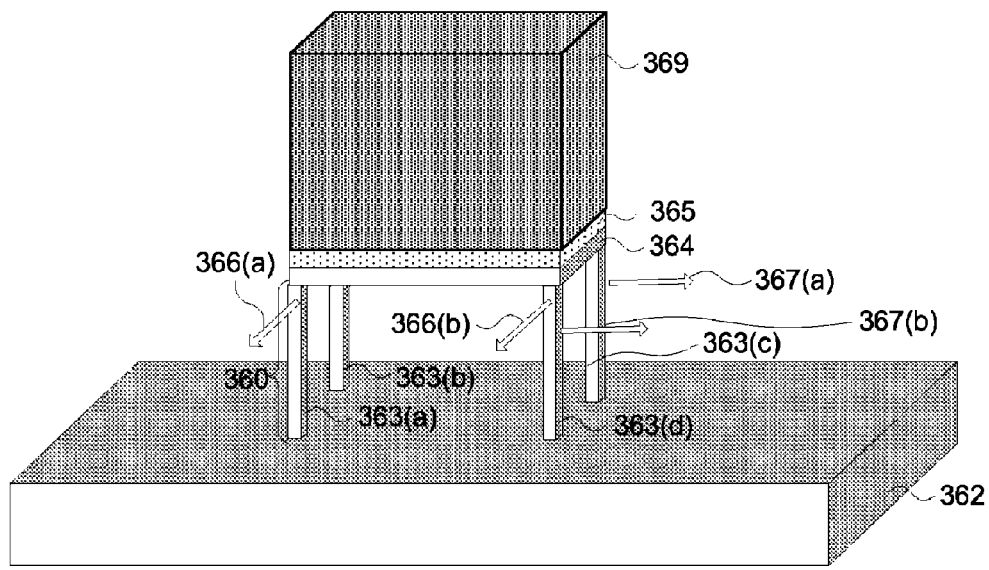
FIG. 25 depicts a perspective view of a portion of an alignment and retention structure including a fixture that may be deformed at an intermediate position between a component mounting location and the rest of the structure so that the component location may be adjusted relative to the rest of the structure beyond that associated with the initial mounting of the component.

FIG. 25 depicts a perspective view of a portion of an alignment and retention structure including a fixture 360 that is deformable at a position intermediate to a component mounting location and a base 362 so that the component location is adjustable relative to the base and, as such, relative to the rest of the structure. The fixture of FIG. 25 includes four legs 363a-363d which are located in a rectangular pattern. On top of the legs is a mounting plate 364 and on top of the mounting plate an optional softenable material is located. The component is mounted on the softenable material. A vertical adjustment of the component may be made via the softenable material as noted above with regard to FIG. 24. A horizontal adjustment in a first direction may be made by bending legs 363a-363d at their meeting points with base 362 and plate 364 in the direction of arrows 366a and 366b and in the other direction by bending the legs in the direction of 367a and 367b. In some embodiments, the bending of the legs may be facilitated by a narrowing of the width of the legs at the junction points in the direction of desired adjustment. Any variation in vertical position that results from the bending of the legs may be accommodated by adjustments associated with softening the material 365. In some embodiments, the fixture of FIG. 25 may be made monolithically. In other embodiments, purely mechanical deformations may be used to obtain movement in all three directions and even in orientation as well. Various alternatives to the adjustable fixture of FIG. 25 are possible. U.S. Pat. No. 6,416,937, to Flanders et al., entitled "Optical Component Installation Process", sets forth an installation process using adjustable mounting fixtures. This patent is hereby incorporated herein by reference as if set forth herein in full.

Figure 26A:
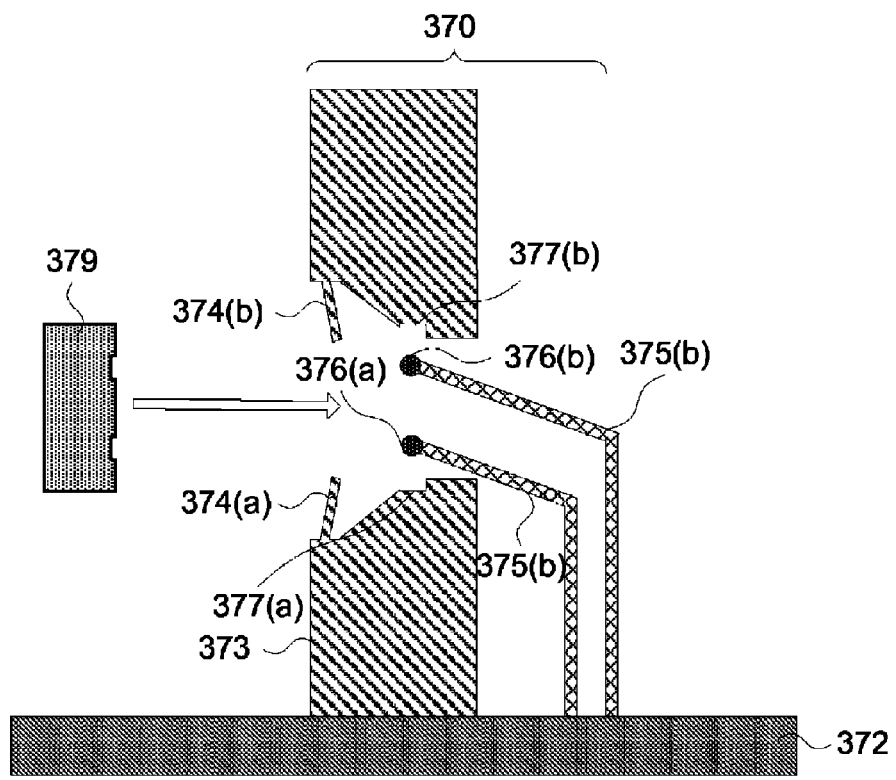
FIGS. 26A and 26B depict side views of an alignment and retention structure that includes a fixture having retention elements, guide elements, and electrical contact elements that are independent of but positioned relative to the other components of the fixture.
Figure 26B:
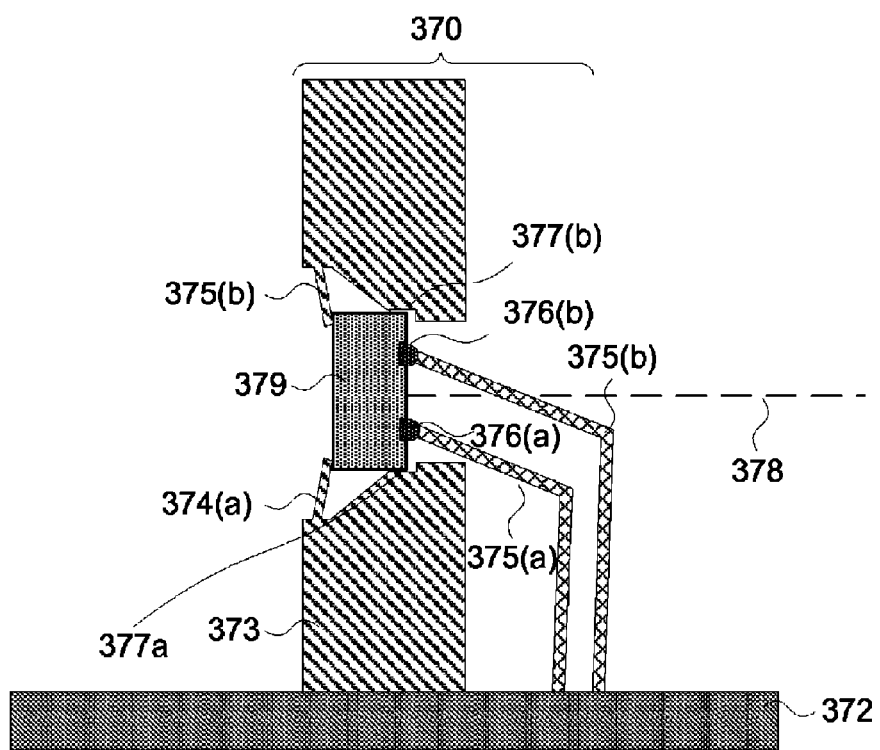

FIGS. 26A and 26B depict side views of an alignment and retention structure that includes a fixture 370 having retention elements 374a and 374b, guide elements 377a and 377b, and electrical contact elements 375a and 375b. The electrical contact elements are mounted directly onto a base 372 and are independent of alignment fixture frame 373 with the exception of their contact at contractors 376a and 376b with the component 379 when it is loaded into the fixture. FIG. 26A shows the component prior to loading it in the fixture while FIG. 26B depicts the component after loading. The alignment and retention features of this embodiment are similar to that of FIGS. 17A and 17B and FIGS. 23A and 23B with the exception that both the left and right sides (the top and bottom relative to FIGS. 17A and 17B and FIGS. 23A and 23B) are not blocked or shadowed by a portion of a base or a frame. If component 379 is an optical generation or detection device and if contactors 376a and 376b provide electrical input or output to the same side of the component as its optically active surface, the configuration of the FIGS. 26A and 26B allows mounting and use of such a component. Element 378 depicts an optical path coming from or going to component 379.

In some embodiments the conductive elements 375a and 375b may originate on frame 373 or may be supported by elements extending from the frame 373. In other embodiments, various other configurations of the alignment and retention fixture are possible and will be apparent to those of skill in the art upon reviewing the teachings herein.

Figure 27A:
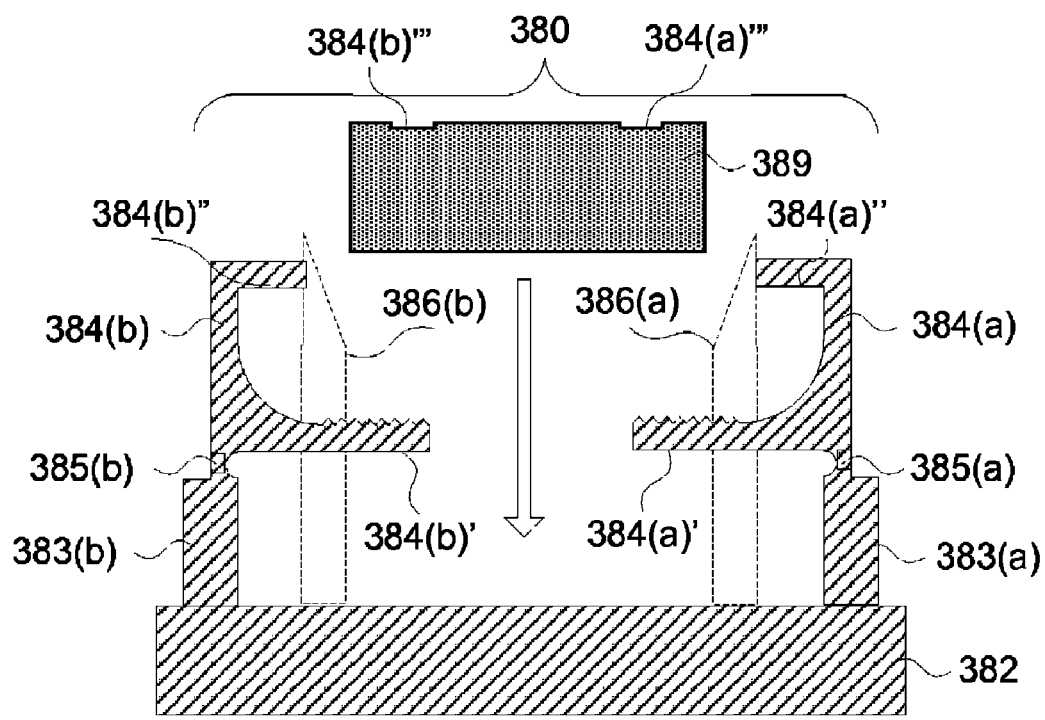
FIGS. 27A and 27B depict side views of a portion of an alternative alignment and retention structure that includes a fixture having retention clips that are closed onto the component as the component is loaded into the fixture.
Figure 27B:
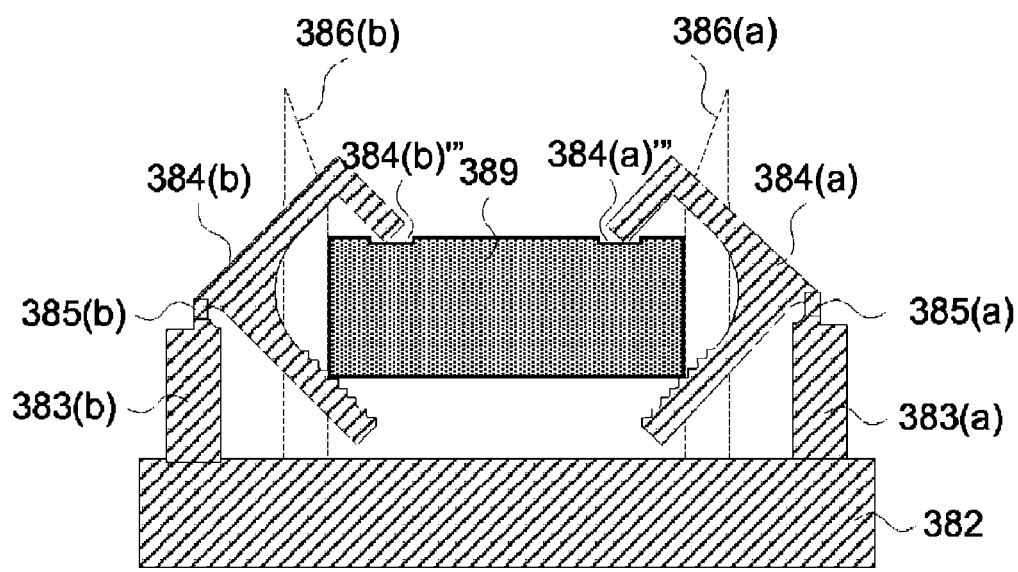

FIGS. 27A and 27B depict side views of a portion of an alternative alignment and retention structure that includes a fixture 380 having retention clips 384a and 384b that are closed onto component 389 as the component is loaded into the fixture. The fixture is attached to a base 382 and includes legs 383a and 383b, pivot regions 385a and 385b. As indicated by the dashed outlines of structures 386a and 386b, guide structures may be included in the alignment fixture to ensure that the component is loaded in the fixture with the right orientation and alignment. In alternative embodiments, no guides may be used or additional guides may be used and the guides may have various configurations. As component 389 is loaded into the fixture the upper portion of the fixture begins to bend inward as the bottom of the component contacts the lower portions (i.e. actuation levers) 384a' and 384b' of clips 384a and 384b. The bending forward continues until the tips 384a" and 384b" of clips 384a and 384b contact the electrical pads 384a''' and 384b'''. As indicated in FIGS. 27A and 27B, the upper surfaces of the lower portions 384a' and 384b' may be roughened, knurled, stair stepped or otherwise patterned to increase the stability of the matting of the clips and the component. In some embodiments pivot regions may, for example, be bendable joins or rotatable structures.

Figure 28A:
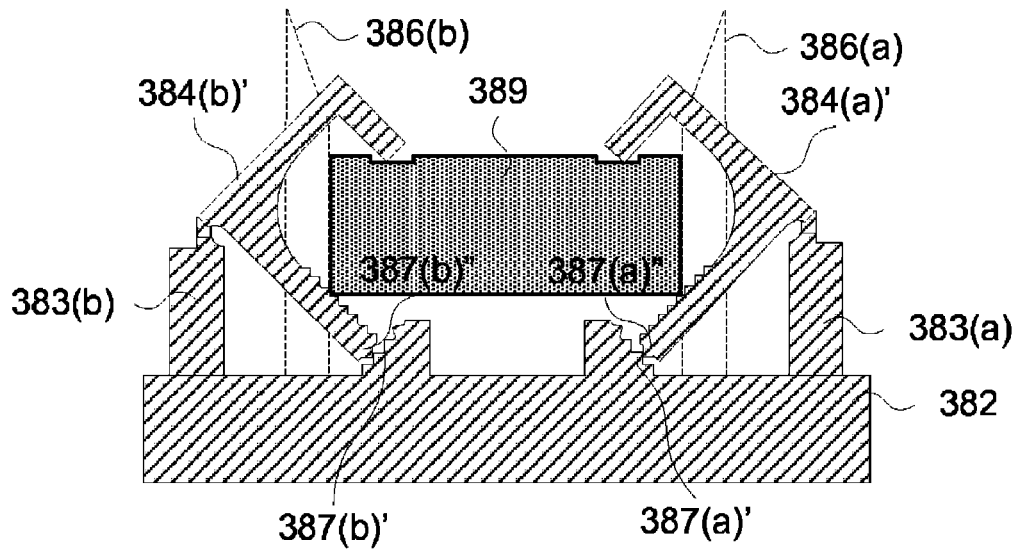
FIG. 28A depicts a variation of the alignment and retention structure of FIGS. 27A and 27B where the moving portion of the fixture engages another portion of the structure to help lock the fixture/component in a retention position.
Figure 28B:
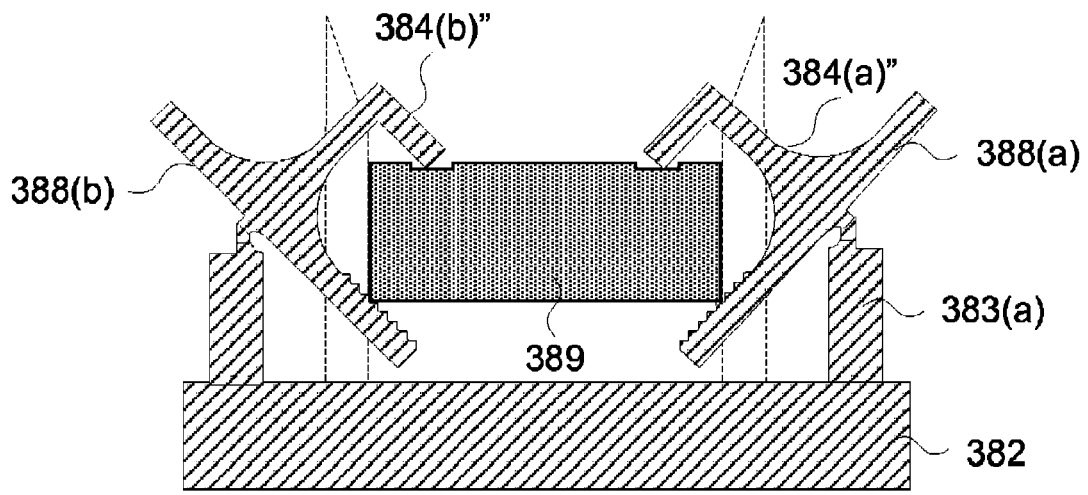
FIG. 28B depicts a variation of the alignment and retention structure of FIGS. 27A and 27B where the fixture includes outward facing levers that may be used to move the structure from a retention position to an open position.

Various alternatives to the embodiment of FIGS. 27A and 27B are possible and will be apparent to those of skill in the art. Two examples are illustrated in FIGS. 28A and 28B. In FIG. 28A the moving portion 384a' and 384b' of the fixture 380 engages another portion 387a' and 387b' of the structure via extensions 387a" and 387b" to help lock the fixture/component in a retention position. In some embodiments, structures 387a' and 387b' and extensions 387a" and 387b" may be of a ratcheted configuration while in other embodiments they may simply be stair-stepped as depicted. In some embodiments structures 387a' and 387b' may be on elastomeric (e.g. compressible) mounts, or may be formed from an elastomeric material, to give sufficient retention force while still allowing component release and the seating of new components. In still other alternatives extensions 387a" and 387b" may be located on a elastomeric structures. In still further alternatives, a release mechanism may be provided to aid in separating the engaged portions. In FIG. 28B, the fixture is shown as including outward facing levers 388a and 388b that may be used to move portions 384a" and 384b" from a retention position to an open position. Many other alternatives will be apparent to those of skill in the art upon reviewing the disclosure herein.

Figure 29A:
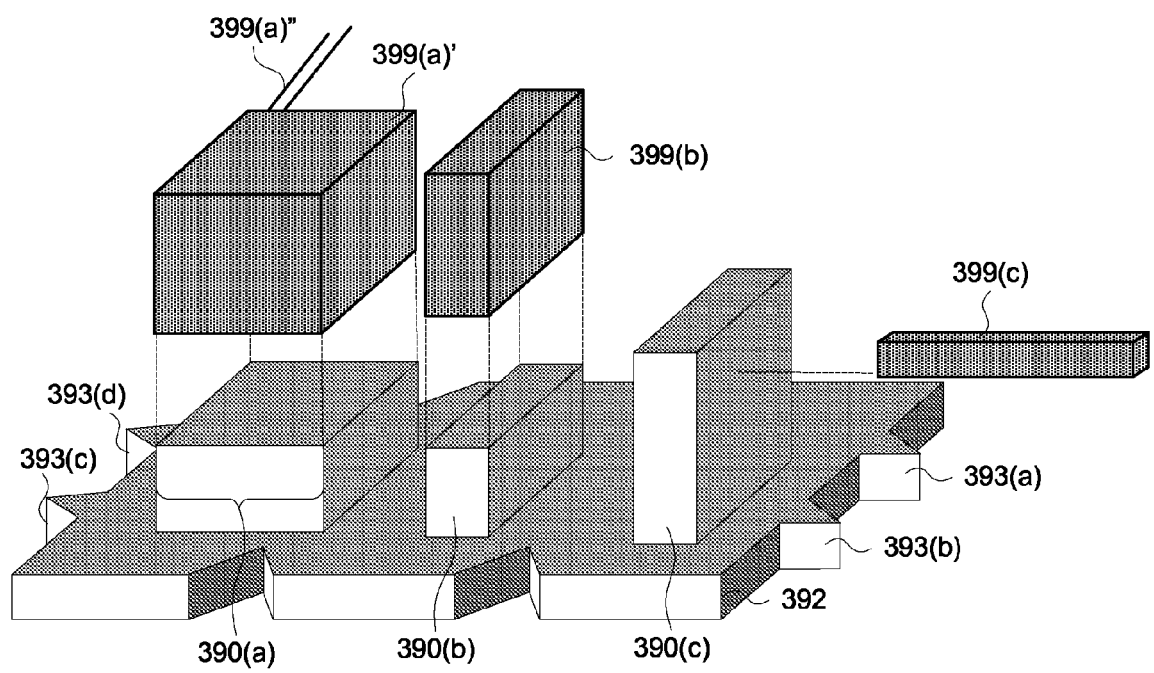
FIGS. 29A-29C depict perspective views of a device that contains an alignment and/or retention structure, components, and a packaging structure having passages for various internal-to-external connections.
Figure 29B:
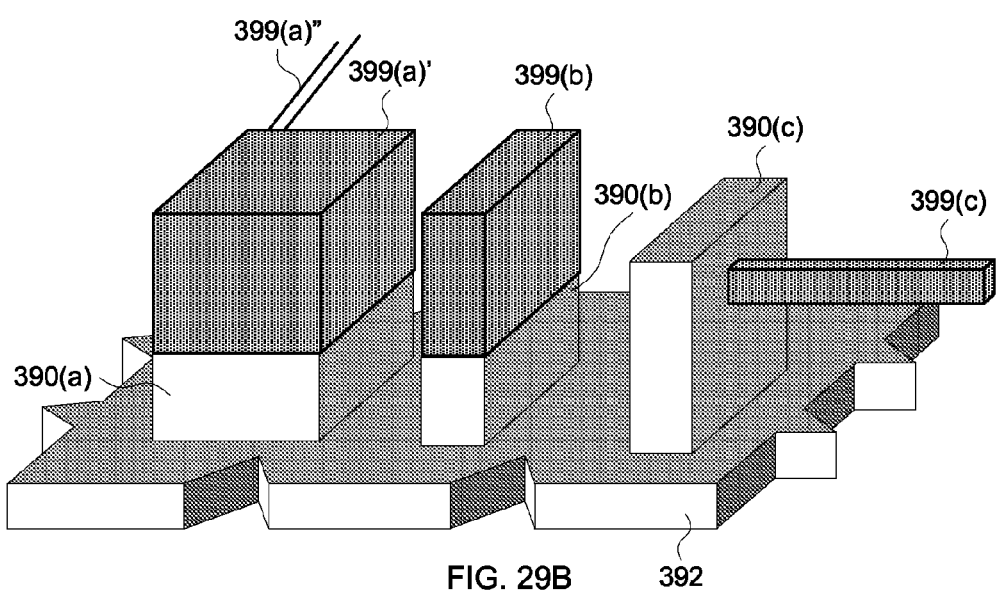
Figure 29C:
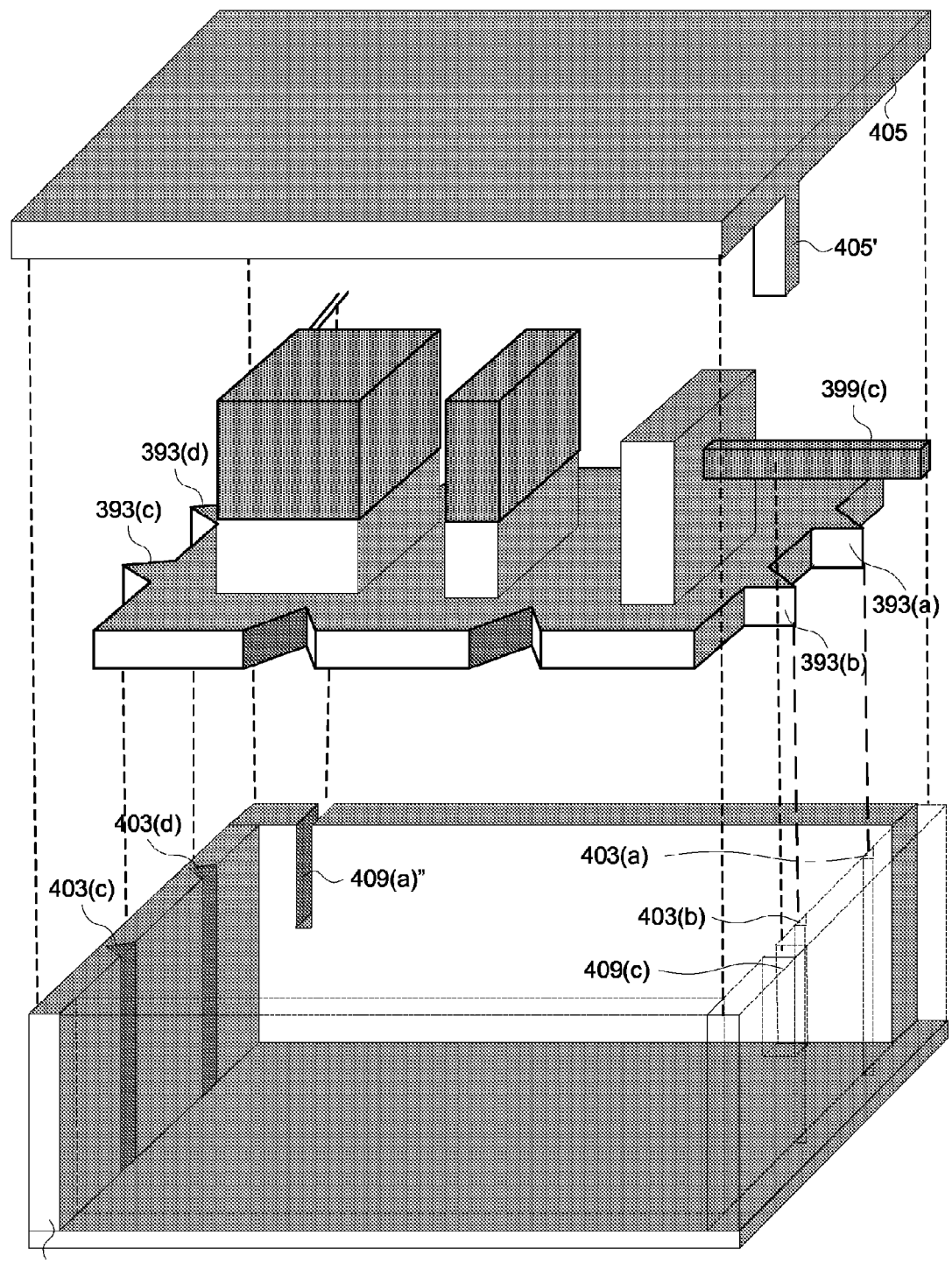

FIGS. 29A-29C depict perspective views of a device that contains an alignment and/or retention structure (including fixtures 390a-390c and a base 392 having alignment structures), components 399a', 399a", 399b, and 399c, and a packaging structure 402 and 405 and having passages 409a" and 409c. FIG. 29A shows components 399a' and 399a", 399b, and 399c separated from their respective alignment fixtures 390a, 390b, and 390c. FIG. 29B depicts the components mounted on their respective alignment structures. In FIG. 29C the component/alignment fixture combination is located between a package lid 405 and a package bottom 402 and is ready for mounting into bottom 402 via mating alignment marks 393a-393d and 403a-403d. Component 399c extends out of the assembled device package via slot 409c and component 399a" will extend out of the assembled package via slot 409a". The top portions of slots 409c and 409a" will be filled by structures such as 405', that extend from lid 405, once the lid is mounted on the bottom 402. In the example of FIGS. 29A-29C component 399c may be one or more fiber optic elements, component 399b may be a lens, component 399a' may be a radiation generating component, and component 399a" may be one or more electrical signal and/or power feed lines.

In some embodiments any gaps in the walls of the package (e.g. where the lid is mounted or where the components pass through) may be sealed in various manners. For example, sealing may occur via gaskets, sealing compounds, meltable conductive or non-conductive materials. In still further embodiments, the package may contain pre-sealed vias (for passing signals between the interior and exterior of a package) with contact structures that mate with electrical leads or other components that are loaded into the package in much the same way contact between alignment fixtures and components is achieved according to the teachings herein. In some embodiments multiple alignment and/or retention structures and associated components may be loaded into a single package. In some embodiments, internal volume of the package may be evacuated, back filled with a desired gas, or even filled with a flowable but settable material. In addition to the packaging embodiments and alternative set forth above, many other alternatives will be apparent upon review of the teachings herein.

The components that may be located and or retained by the structures of various embodiments of the present invention vary considerably, for example, the components may include: (1) electrical and electronic components including both active and passive devices, (2) optical and photonic components, (3) temperature control components, and (5) other mechanical and electromechanical devices. The electrical and electronic components may include, for example, capacitors; inductors; resistors; RF and microwave transmission lines, delay lines, filters, couplers, splitters, and the like; transducers, diodes; transistors; integrated circuits, batteries and other power generation devices, permanent and electromagnets, and the like. Optical and photonic components may include, for example, mirrors, lenses, light sources (e.g. LEDs and lasers), photocells, detectors, fiber optics, filters, windows, and the like. Temperature control components may include, for example, thermistors, thermal couples, heaters, thermal electric coolers, heat pipes, thermal electric materials, heat sinks, and the like. Other mechanical and electromechanical devices include, for example, fluid flow channels, manifolds, valves, pumps, piezoelectric devices, pneumatic devices, actuators, springs, alignment fixtures, and the like.

In some preferred implementations an Electrochemical Fabrication process (EFAB) is used for forming bases, alignment and/or retention fixtures, and any included functional elements. For example, such a process is described above in association with FIGS. 2A-2F. In other processes, additional conductive materials may be used and/or dielectric materials may be used to isolate selective conductive regions from one another. In still other processes, an initial building substrate may be a dielectric or after formation of all layers of deposited material, the structure may be swapped from an original substrate to a second substrate which may be a dielectric. In still other processes, chemical or electrochemical etching may be used to form structures directly or to create cavities into which other material may be deposited. In alternative implementations, an electrochemical extrusion (ELEX) process may be used to form a structure or a portion of the structure.

After formation of each layer of a structure, various post processing operations may be used to complete formation of the alignment and/or retention structures. For example, a single etching operation may be used to remove any sacrificial material, a multi-step etching operation may be used to allow more control of the etching process or to allow various intermediate steps or operations to occur, the partially formed structure may bonded or otherwise combined with other structures.

Various alternative production processes that may be used in forming alignment and/or retention structures some of which are described in the various publications, patents, and patent application incorporated herein by reference.

Various combinations of the teachings in the above embodiments and their alternatives are possible and will be understood by those of skill in the art upon review of the teachings herein. As such, alternatives mentioned explicitly in one embodiment may also have application to other embodiments The patent applications in TABLE 1 are hereby incorporated by reference herein as if set forth in full. The gist of each patent application is included in the table to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways. For example, the various apparatus configurations disclosed in these referenced applications may be used in conjunction with the novel features of the instant invention to provide various alternative apparatus that include the functionality disclosed herein:

TABLE 1

| US Application No. Filing Date | Title Brief Description |
|---|---|
| US App. No. 10/434,295 May 7, 2003 | Method of and Apparatus for Forming Three-Dimensional Structures Integral With Semiconductor Based Circuitry Enhanced Electrochemical fabrication processes are provided that can form three-dimensional multi-layer structures using semiconductor based circuitry as a substrate. Electrically functional portions of the structure are formed from structural material (e.g. nickel) that adheres to contact pads of the circuit. Aluminum contact pads and silicon structures are protected from copper diffusion damage by application of appropriate barrier layers. In some embodiments, nickel is applied to the aluminum contact pads via solder bump formation techniques using electroless nickel plating. In other embodiments, selective electroless copper plating or direct metallization is used to plate sacrificial material directly onto dielectric passivation layers. In still other embodiments, structural material deposition locations are shielded, then sacrificial material is deposited, the shielding is removed, and then structural material is deposited. In still other embodiments structural material is made to attached to non-contact pad regions.. |
| US App. No. 10/434,493 May 7, 2003 | Electrochemically Fabricated Structures Having Dielectric Bases or Active Bases and Methods of and Apparatus for Producing Such Structures Multilayer structures are electrochemically fabricated (e.g. by EFAB ™) on a temporary conductive substrate and are there after are bonded to a permanent dielectric substrate and removed from the temporary substrate. The structures are formed from top layer to bottom layer, such that the bottom layer of the structure becomes adhered to the permanent substrate. The permanent substrate may be a solid sheet that is bonded (e.g. by an adhesive) to the layered structure or the permanent substrate may be a flowable material that is solidified adjacent to or partially surrounding a portion of the structure with bonding occurs during solidification. The multilayer structure may be released from a sacrificial material prior to attaching the permanent substrate or more preferably it may be released after attachment. |
| US App. No. 10/434,103 May 7, 2003 | Electrochemically Fabricated Hermetically Sealed Microstructures and Methods of and Apparatus for Producing Such Structures Multilayer structures are electrochemically fabricated (e.g. by EFAB ™) from at least one structural material (e.g. nickel), at least one sacrificial material (e.g. copper), and at least one sealing material (e.g. solder). The layered structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. |
| US App. No. 10/434,497 May 7, 2003 | Multistep Release Method for Electrochemically Fabricated Structures Multilayer structures are electrochemically fabricated (e.g. by EFAB ™) from at least one structural material (e.g. nickel), that is configured to define a desired structure and which may be attached to a support structure, and at least a first sacrificial material (e.g. copper) that surrounds the desired structure, and at least one more material which surrounds the first sacrificial material and which will function as a second sacrificial material. The second sacrificial material is removed by an etchant and/or process that does not attack the first sacrificial material. Intermediate post processing activities may occur, and then the first sacrificial material is removed by an etchant or process that does not attack the at least one structural material to complete the release of the desired structure. |

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket depositions processes that are not electrodeposition processes. Some embodiments may use selective deposition processes on some layers that are not conformable contact masking processes and are not even electrodeposition processes. Some embodiments may use nickel as a structural material while other embodiments may use different materials such as copper, gold, silver, or any other electrodepositable materials that can be separated from the a sacrificial material. Some embodiments may use copper as the structural material with or without a sacrificial material. Some embodiments may remove a sacrificial material while other embodiments may not. In some embodiments the sacrificial material may be removed by a chemical etching operation, an electrochemical operation, or a melting operation. In some embodiments the anode may be different from the conformable contact mask support and the support may be a porous structure or other perforated structure. Some embodiments may use multiple conformable contact masks with different patterns so as to deposit different selective patterns of material on different layers and/or on different portions of a single layer. In some embodiments, the depth of deposition will be enhanced by pulling the conformable contact mask away from the substrate as deposition is occurring in a manner that allows the seal between the conformable portion of the CC mask and the substrate to shift from the face of the conformal material to the inside edges of the conformable material.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. An alignment structure for receiving a plurality of components, comprising:
   a base;
   a plurality of alignment fixtures attached to the base and having desired positions relative to one another,
   wherein the base and the alignment fixtures are substantially monolithic, and wherein the alignment fixtures comprise a material deposited on substantially a layer-by-layer basis in their respective relative positions, and wherein the structure comprises at least two conductive paths separated from one another by a dielectric, wherein at least one of the paths meets a criteria selected from the group consisting of:
   (1) the at least one path forms a connection between at least two electrical contact points on a single component;
   (2) the at least one path forms a connection between electrical contact points on at least two different components;
   (3) the at least one path allows an electrical connection to be made from the structure to a separate structure;
   (4) the structure is adapted to be located in a substantially hermetic package and the at least one path allows an electrical connection to be made from the structure to a separate structure that is external to the package;
   (5) the at least one path makes an electrical connection to an electrically functional device that was formed along with the structure; and
   (6) the at least one path comprises a component that modifies an signal selected from the group consisting of RF signals and microwave signals.

2. The structure of claim 1 wherein the base and at least a portion of the alignment fixtures are connected by a deformable material that allows fine adjustments of the fixtures relative to the base to be made to optimize alignment of components.

3. The structure of claim 2 wherein the deformable material comprises a low melting point metal that can be heated to allow deformation.

4. The structure of claim 2 wherein the deformable material is a material that comprises a structural configuration that allows relatively easy deformation along at least one axis.

5. The structure of claim 1 wherein at least one alignment fixture comprises at least one stop in a direction of motion parallel to a plane of a surface of the base.

6. The structure of claim 1 wherein at least one alignment fixture comprises at least one stop in a direction of motion perpendicular to a plane of a surface of the base.

7. The structure of claim 1 additionally comprising retention fixtures that provide for retention of multiple components.

8. The structure of claim 1 wherein the alignment fixtures comprise spring elements that provide for retention of components.

9. The structure of claim 1 further comprising spring elements that provide component retention and whose production comprises a process selected from the group consisting of:
   (1) selectively electrodepositing a first conductive material and electrodepositing a second conductive material, wherein one of the first or second conductive materials is a sacrificial material and the other is a structural material;
   (2) electrodepositing a first conductive material, selectively etching the first structural material to create at least one void, and electrodepositing a second conductive material to fill the at least one void;
   (3) electrodepositing at least one conductive material, depositing at least one flowable dielectric material, and depositing a seed layer of conductive material in preparation for formation of a next layer of electrodeposited material, and
   (4) selectively electrodepositing a first conductive material, then electrodepositing a second conductive material, then selectively etching one of the first or second conductive materials, and then electrodepositing a third conductive material, wherein at least one of the first, second, or third conductive materials is a sacrificial material and at least one of the remaining two conductive materials is a structural material.

10. A device, comprising:
   (a) an alignment structure, comprising:
      (1) a base;
      (2) a plurality of alignment fixtures adhered to the base and having desired positions relative to one another;
   (b) a plurality of components mounted on the alignment structure in positions dictated by the alignment fixtures, wherein
   the base and the alignment fixtures are monolithic, and wherein the alignment fixtures comprise a material deposited on substantially a layer-by-layer basis in their respective relative positions, and wherein the structure comprises at least two conductive paths separated from one another by a dielectric, wherein at least one of the paths meets a criteria selected from the group consisting of:
   (1) the at least one path forms a connection between at least two electrical contact points on a single component;
   (2) the at least one path forms a connection between electrical contact points on at least two different components;
   (3) the at least one path allows an electrical connection to be made from the structure to a separate structure;

(4) the structure is adapted to be located in a substantially hermetic package and the at least one path allows an electrical connection to be made from the structure to a separate structure that is external to the package;

(5) the at least one path makes an electrical connection to an electrically functional device that was formed along with the structure; and (6) the at least one path comprises a component that modifies an signal selected from the group consisting of RF signals and microwave signals.

11. The device of claim 10 wherein the base and at least a portion of the alignment fixtures are connected by a deformable material that allows fine adjustments of the fixtures relative to the base to be made to optimize alignment of components.

12. The device of claim 11 wherein the deformable material comprises a low melting point metal that can be heated to allow deformation.

13. The device of claim 12 wherein the deformable material is a material that comprises a structural configuration that allows relatively easy deformation along at least one axis.

14. The device of claim 10 wherein at least one alignment fixture comprises at least one stop in a direction of motion parallel to a plane of a surface of the base.

15. The device of claim 10 wherein at least one alignment fixture comprises at least one stop in a direction of motion perpendicular to a plane of a surface of the base.

16. The device of claim 10 additionally comprising retention fixtures that provide for retention of multiple components.

17. The device of claim 10 wherein the alignment fixtures comprise spring elements that provide for retention of components.

18. The device of claim 10 further comprising spring elements that provide component retention and wherein production of at least a portion of the device comprises a process selected from the group consisting of:

(1) selectively electrodepositing a first conductive material and electrodepositing a second conductive material, wherein one of the first or second conductive materials is a sacrificial material and the other is a structural material;

(2) electrodepositing a first conductive material, selectively etching the first structural material to create at least one void, and electrodepositing a second conductive material to fill the at least one void;

(3) electrodepositing at least one conductive material, depositing at least one flowable dielectric material, and depositing a seed layer of conductive material in preparation for formation of a next layer of electrodeposited material, and (4) selectively electrodepositing a first conductive material, then electrodepositing a second conductive material, then selectively etching one of the first or second conductive materials, and then electrodepositing a third conductive material, wherein at least one of the first, second, or third conductive materials is a sacrificial material and at least one of the remaining two conductive materials is a structural material.

* * * * *